United States Patent
Miyauchi et al.

(10) Patent No.: US 6,732,322 B1
(45) Date of Patent: May 4, 2004

(54) ENCODING METHOD AND MEMORY DEVICE

(75) Inventors: Toshiyuki Miyauchi, Tokyo (JP); Masayuki Hattori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/381,661

(22) PCT Filed: Jan. 21, 1999

(86) PCT No.: PCT/JP99/00217
§ 371 (c)(1),
(2), (4) Date: Nov. 23, 1999

(87) PCT Pub. No.: WO99/38170
PCT Pub. Date: Jul. 29, 1999

(30) Foreign Application Priority Data

Jan. 21, 1998 (JP) .............................. 10/9957
Jan. 21, 1998 (JP) .............................. 10/9958

(51) Int. Cl.[7] .............................. H03M 13/00
(52) U.S. Cl. .................. 714/784; 714/756; 714/763
(58) Field of Search .................. 714/784, 752, 714/756, 763

(56) References Cited

U.S. PATENT DOCUMENTS

| | | | | |
|---|---|---|---|---|
| 5,459,742 A | * | 10/1995 | Cassidy et al. ............. | 714/769 |
| 5,475,716 A | * | 12/1995 | Huang ....................... | 375/354 |
| 5,675,559 A | * | 10/1997 | Maeda et al. .............. | 369/124.07 |
| 5,719,884 A | * | 2/1998 | Roth et al. .................. | 714/755 |
| 5,740,143 A | * | 4/1998 | Suetomi .................... | 369/47.33 |
| 5,751,634 A | * | 5/1998 | Itoh .......................... | 365/185.17 |
| 6,178,537 B1 | * | 1/2001 | Roohparvar ................ | 714/773 |
| 6,208,803 B1 | * | 3/2001 | Shimizu ..................... | 386/116 |

FOREIGN PATENT DOCUMENTS

| | | | |
|---|---|---|---|
| JP | 9-134313 | 5/1997 | ........... G06F/12/16 |
| JP | 9-274591 | 10/1997 | ........... G06F/12/16 |
| JP | 9-288895 | 11/1997 | ........... G11C/16/04 |

* cited by examiner

*Primary Examiner*—Albert Decady
*Assistant Examiner*—Esaw Abraham
(74) *Attorney, Agent, or Firm*—Sonnenschein, Nath & Rosenthal LLP

(57) ABSTRACT

This invention relates to a memory apparatus or the like adaptable to a multi-value recording flash memory and others. A flash memory 10 is designed for 16-value (4-bit) recording. For a write operation, the encoder (12) converts input data Din into an abbreviated Reed-Solomon code to provide write data WD. The converter (13) converts the write data WD into four-bit parallel data. The converted data are fed and written to the each memory cell constituting cell arrays (11) successively. For a read operation, the converter (14) converts read data RD from the cell arrays (11) into one-byte (8-bit) parallel data and supplies the converted data to the decoder (15) for error correction in units of bytes, whereby output data Dout is obtained. Since the Reed-Solomon code is used, sufficient performance with a limited number of errors to be corrected can be obtained.

7 Claims, 24 Drawing Sheets

DATA = "0"

DATA = "1"

DATA = "1 1"

DATA = "1 0"

DATA = "0 1"

DATA = "0 0"

ENCODING METHOD AND MEMORY DEVICE

TECHNICAL FIELD

The present invention relates to an encoding method and a memory apparatus applicable preferably to a multi-valued recording flash memory, a memory card using that flash memory and so on.

BACKGROUND ART

In recent years, as the memory apparatus, semiconductor memories such as flash memories have been widely used. In the flash memory, data are recorded by using cell arrays that comprise a large number of memory cells (numbering usually about 65 million) comprising floating gates (charge storage layer) and control gates arranged in layered fashion on a semiconductor substrate (see FIG. 16). In this case, each of the cell arrays retains data as charge quantities stored in floating gates.

FIGS. 17A and 17B illustrate a structure of a memory cell 100 used in a flash memory. That is, the memory cell 100 is so formed as to stack a charge storage layer (floating gate) 102 and a control gate 103 on a semiconductor substrate 101. When a data item is to be written to the memory cell 100, the quantity of charge held in the floating gate 102 is controlled so that it is reached to one of two threshold voltages shown in FIG. 18 according to the data ("0" or "1") to be recorded. On the other hand, when the data item is to be read from the memory cell 100, by using a reference voltage set between the two threshold voltages, it is determined that the data item in the memory cell 100 is judged to be "0" or "1" depending on whether the threshold voltage of the memory cell 100 is higher or lower than the reference voltage.

It is critical to semiconductor memories to prevent declines in reliability stemming from diverse effects of high-integration, high-density circuit implementation. As part of the effort to preserve memory device reliability, an error correcting circuit based on an error correcting code such as the Hamming code is often incorporated in the semiconductor memory in order to counter aging-induced failures such as faulty cells, resulting in particular from an increasing number of write and erase operations.

The error correcting code is a redundant code called check data attached to information data and then the check data are used to correct an error in the entire code. For example, 10-bit check data as shown in FIG. 19 are added to an abbreviated Hamming code for a 512-bit block of information data so that, even if one error occurs in the 522-bit code, the error may be corrected.

FIG. 20 shows a structure of a flash memory 110 incorporating an error correcting circuit based on the Hamming code therein. The flash memory 110 comprises cell arrays 111 having a plurality of memory cells, an encoder 112 converting input data Din into an abbreviated Hamming code to provide write data WD to be written to the cell arrays 111 and a Hamming code decoder 113 providing output data Dout by subjecting read data RD retrieved from the cell arrays 111 to an error correction process. In this case, the encoder 112 and Hamming code decoder 113 constitute an error correcting circuit. The encoder 112 adds 10-bit check data to every 512-bit block of input data Din and the abbreviated Hamming code for the 512-bit information data is created.

In the flash memory 110 shown in FIG. 20, a data write operation takes place as follows. That is, input data Din are first inputted to the encoder 112. Then, the encoder 112 converts the input data Din into the abbreviated Hamming code for 512-bit information data, thereby generating write data WD. The write data WD outputted from the encoder 112 are fed and written to the cell arrays 111.

On the other hand, a data read operation is carried out as follows. Read data RD retrieved from the cell arrays 111 are inputted to the Hamming code decoder 113. If one code of the read data RD contains no error, the Hamming code decoder 113 outputs the information data unchanged as output data Dout. If one code of the read data RD has one erroneous bit, the Hamming code decoder 113 outputs the information data as the output data Dout after correcting the error.

Next, an example in which an abbreviated BCH code (Bose-Chaudhuri-Hocquenghem code) is used as an error correcting code capable of correcting two errors in one code will be described. The BCH code and techniques of code abbreviation are discussed illustratively by Hideki Imai in "Code Theories" (Institute of Electronics, Information and Communication Engineers of Japan) among others. For example, 20-bit check data are added to the abbreviated BCH code for 512-bit information data as shown in FIG. 21, thereby enabling to correct two errors in the 532-bit code.

FIG. 22 shows a structure of a flash memory 120 incorporating an error correcting circuit based on the BCH code. The flash memory 120 comprises cell arrays 121 having a plurality of memory cells, an encoder 122 for converting input data Din into an abbreviated BCH code to provide write data WD to be written to the cell arrays 121 and a BCH code decoder 123 for subjecting read data RD retrieved from the cell arrays 121 to an error correction process to provide output data Dout. In this case, the encoder 122 and the BCH code decoder 123 constitute an error correcting circuit. The encoder 122 adds 20-bit check data to every 512-bit block of input data Din and the abbreviated BCH code capable of correcting two errors regarding the 512-bit information data is created.

In the flash memory 120 shown in FIG. 22, a data write operation takes place as follows. That is, input data Din are first inputted to the encoder 122. Then, the encoder 122 converts the input data Din into the abbreviated BCH code for 512-bit information data, thereby generating write data WD. The write data WD outputted from the encoder 122 are fed and written to the cell arrays 121.

On the other hand, a data read operation is carried out as follows. Read data RD retrieved from the cell arrays 121 is inputted to the BCH code decoder 123. If one code of the read data RD contains no error, the BCH code decoder 123 outputs the information data unchanged as output data Dout. If one code of the read data RD has one or two erroneous bits, the information data are outputted as the output data Dout after correcting the error.

As shown in FIGS. 20 and 22, the error correcting circuit incorporated in the flash memory 110 or 120 can suppress errors of written data despite a certain number of faulty cells caused by aging. However, generally in the error correcting code, a relatively large quantity of the check data, which are redundant check data, are required to correct a fairly large number of errors and thus, the number of memory cells to be used is increased as well as the scale of the error correcting circuit to be incorporated is enlarged.

Next, a memory card constituted by a plurality of flash memories (flash memory chips) will be described. As a memory device for storing quantities of data that cannot be handled by a single-chip flash memory, the memory card includes multiple flash memories and a controller.

FIG. 23 shows a structure of a memory card 130 with a controller having an error correcting circuit based on the BCH code. The memory card 130 includes two flash memories 131 and 132 and a controller 133 for writing and reading data to and from these flash memories 131 and 132.

The controller 133 comprises a card interface 134 for exchanging data with an entity outside the card, an encoder 135 for converting input data Din into an abbreviated BCH code to provide write data WD to be written to the flash memories 131 and 132, a BCH code decoder 136 for subjecting read data RD from the flash memories 131 and 132 to an error correction process to provide output data Dout, and a flash interface 137 for controlling the writing and reading of data to and from the flash memories 131 and 132.

In the above structure, the encoder 135 and the BCH code decoder 136 constitute an error correcting circuit. The encoder 135 adds 20-bit check data to every 512-bit block of input data Din, thus creating an abbreviated BCH code capable of correcting two errors regarding the 512-bit information data.

In the memory card 130 shown in FIG. 23, a data write operation takes place as follows. That is, input data Din are first taken into the card by the card interface 134 and supplied to the encoder 135. Then, the encoder 135 converts the input data Din into the abbreviated BCH code for 512-bit information data, thereby generating write data WD. The write data WD outputted from the encoder 135 are written to the flash memory 131 or 132 under control of the flash interface 137.

On the other hand, a data read operation is carried out as follows. Read data RD retrieved from the flash memory 131 or 132 under control of the flash interface 137 are inputted to the BCH code decoder 136. If one code of the read data RD contains no error, the BCH code decoder 136 outputs the information data unchanged as output data Dout. If one code of the read data RD has one or two erroneous bits, the BCH code decoder 136 outputs the information data as the output data Dout after correcting the error(s). In this way, the output data Dout are outputted from the BCH code decoder 136 to an entity outside the card via the card interface 134.

As described above, the error correcting code is also used in a memory card made of a plurality of flash memories. If a controller is used for error correction, it is possible to have a characteristic that error correcting circuit larger than an error correcting circuit incorporated in the flash memory is obtained so that the greater number of errors may be corrected.

Next, multi-value recording of a flash memory will be described. In recent years, flash memories are proposed for multi-bits recording per cell in an effort to increase storage capacity of the flash memory. For example, as shown in FIGS. 24A through 24D, the quantity of charge accumulated in a floating gate 102 in a memory cell 100 of a flash memory for four-value recording is controlled so that it may attain one of four threshold voltages shown in FIG. 25 representing a data item to be stored ("11," "10," "01" or "00"). When data are read, three reference voltages each established between the respective adjacent threshold values are used. By comparing the threshold value in the memory cell 100 with each of the reference voltages, the data from the memory cell 100 are retrieved. This arrangement allows each memory cell 100 to store two-bit information.

Multi-value recording flash memories may, as with their binary recording counterparts, utilize an error correcting circuit as well. FIG. 26 shows a structure of a flash memory 140 for 16-value (4-bit) recording incorporating an error correcting circuit based on the BCH code. The flash memory 140 comprises cell arrays 141 having a plurality of memory cells, an encoder 142 for converting input data Din into an abbreviated BCH code to provide write data WD to be written to the cell arrays 141 and a one-bit/four-bit converter 143 for converting write data WD outputted from the encoder 142 from serial data format to four-bit parallel data format and supplying the converted data to the cell arrays 141.

The flash memory 140 also includes a four-bit/one-bit converter 144 for converting read data RD retrieved from the cell arrays 141 from four-bit parallel data format to serial data format and a BCH code decoder 145 for providing output data Dout by subjecting to an error correction process the read data RD converted to serial data by the four-bit/one-bit converter 144. In this case, the encoder 142 and the BCH code decoder 145 constitute an error correcting circuit. The encoder 142 adds 20-bit check data to every 512-bit block of input data Din, thereby creating an abbreviated BCH code capable of correcting two errors regarding the 512-bit information data.

In the flash memory 140 shown in FIG. 26, a data write operation takes place as follows. That is, input data Din are first inputted to the encoder 142. Then, the encoder 142 converts the input data Din into the abbreviated BCH code for 512-bit information data, thereby generating write data WD. The write data WD outputted from the encoder 142 are converted by the one-bit/four-bit converter 143 from serial data format to four-bit parallel data format (four-bit data for storage into memory cells), thus supplying the write data WD to the cell arrays 141 and writing the data WD consecutively to each of memory cells making up the cell arrays 141.

On the other hand, a data read operation is carried out as follows. Read data RD retrieved from cell arrays 141 are converted by the four-bit/one-bit converter 144 from four-bit parallel data format to serial data format. The converted serial data are supplied to the BCH code decoder 145. If one code of the read data RD contains no error, the BCH code decoder 145 outputs the information data unchanged as output data Dout. If one code of the read data RD has one or two erroneous bits, the BCH code decoder 145 outputs the information data as the output data Dout after correcting the error(s).

The multi-value recording flash memories such as the flash memory 140 shown in FIG. 26 have such a characteristic that a single faulty cell causes multiple erroneous bits. Since conventional flash memories have stored one bit per memory cell, these memories principally have used code systems for bit error correction as their error correcting code. However, if a single faulty memory cell results in a plurality of erroneous bits, the error correcting code for bit-by-bit error correction is inefficient.

For example, in a flash memory wherein each memory stores four bits of data, if a single memory cell is found inaccessible, four correcting codes have to be used to correct this error. As described above, if the above error correcting code is used to correct many such errors, a large error correcting circuit is needed so that this causes a disadvantage of an expanded scale of the error correcting circuit. Because an increasing amount of redundant data needs to be added in order to correct many errors, numerous memory cells are required, which poses another disadvantage.

It is therefore an object of the present invention to provide a memory apparatus having an error correcting circuit of a small scale and a limited number of memory cells, wherein it may maintain sufficient performance by a small number of correcting errors. It is another object of the present invention to provide an encoding method and a memory apparatus using that method, whereby the length of a code is extended while data exchanges with an outside entity are still carried out, for example, in units of bytes.

DISCLOSURE OF INVENTION

In carrying out the invention and according to one aspect thereof, there is provided a memory apparatus comprising cell arrays having a plurality of memory cells each storing multi-bit information, an encoder for converting input data into a Reed-Solomon code to provide write data to be written to the cell arrays and a Reed-Solomon code decoder for subjecting read data retrieved from the cell arrays to an error correction process to provide output data.

According to another aspect of the invention, there is provided a memory apparatus comprising a memory portion having cell arrays made of a plurality of memory cells each storing multi-bit data and a controller for writing and reading data to and from the memory portion wherein the controller includes an encoder for converting input data into a Reed-Solomon code to provide write data to be written to the memory portion and a Reed-Solomon code decoder for subjecting read data retrieved from the memory portion to an error correction process to provide output data.

With the present invention, each memory cell of the cell arrays stores multi-bit data. For a write operation, the encoder converts input data into a Reed-Solomon code as write data to be written to the cell arrays. The Reed-Solomon code reckons a plurality of bits as one byte and is an error correction code used for error correction in units of bytes. For a read operation, multi-bit data are read from each memory cell of the cell arrays and the read data are subjected to an error correction process by the Reed-Solomon code decoder, thereby providing output data.

In this way, the Reed-Solomon code for error correction in units of bytes is thus used as the error correcting code for the memory apparatus made of memory cells each storing multi-bit data so that it is possible to provide sufficient performance involving a limited number of correcting errors. This makes it possible to reduce the error correcting circuit in scale with a smaller number of memory cells to be used than before.

Further, according to a further aspect of the invention, there is provided an encoding method comprising the steps of supplementing (n-m) bit data with m-bit data for conversion into n-bit data, n being greater than m, encoding the n-bit data using a Reed-Solomon code reckoning n bits as one symbol, and outputting as information data the m-bit data before supplementing the (n-m) bit data while outputting as check data the m-bit data after having undergone n-bit/m-bit conversion.

Further, according to an even further aspect of the invention, there is provided a memory apparatus comprising cell arrays having a plurality of memory cells, an encoder for converting input data into an error correcting code to provide write data to be written to the cell arrays, and a decoder for subjecting read data retrieved from the cell arrays to an error correction process to provide output data, characterized in that the encoder supplements (n-m) bit data with m-bit input data for conversion into n-bit data, n being greater than m, encodes the n-bit data using a Reed-Solomon code reckoning n bits as one symbol and outputs as information data the m-bit data before supplementing the (n-m) bit data while outputting as check data the m-bit data after having undergone n-bit/m-bit conversion and that the decoder supplements the (n-m) bit data relating to an information data part thereof with the m-bit read data retrieved from the cell arrays for conversion into n-bit data, subjects a check data part to m-bit/n-bit conversion into n-bit data, thereafter submits the converted n-bit data to an error correction process and provides as the output data an m-bit data part in the corrected n-bit information data.

Further, according to a still further aspect of the invention, there is provided a memory apparatus comprising a memory portion having cell arrays made of a plurality of memory cells and a controller for writing and reading data to and from the memory portion, characterized in that the controller includes an encoder for converting input data into an error correcting code to provide write data to be written to the memory portion, and a decoder for subjecting read data retrieved from the memory portion to an error correction process to provide output data, wherein the encoder supplements (n-n) bit data with m-bit input data for conversion into n-bit data, n being greater than m, encodes the n-bit data using a Reed-Solomon code reckoning n bits as one symbol and outputs as information data the m-bit data before supplementing the (n-m) bit data while outputting as check data the m-bit data after having undergone n-bit/m-bit conversion, and wherein the decoder supplements the n-m bit data with m-bit read data retrieved from the cell arrays for conversion into n-bit data relating to an information data part thereof, subjects a check data part of the m-bit read data to m-bit/n-bit conversion into n-bit data, thereafter submits the converted n-bit data to an error correction process and provides as the output data an m-bit data part in the corrected n-bit information data.

With the present invention, each memory cell of the cell arrays stores data of one bit or plural bits. For a write operation, m-bit input data are inputted to the encoder. The (n-m) bit data (n>m) of, for example, 0 are supplemented with m-bit input data for conversion into n-bit data. For example, eight-bit input data are supplemented with two-bit zeros for conversion into 10-bit data. The n-bit data are then converted to a Reed-Solomon code reckoning n bites as one symbol. The m-bit data before supplementing the (n-m) bit data are outputted as information data, while the m-bit data after having undergone n-bit/m-bit conversion are outputted as check data. Then, the m-bit data outputted from the encoder are fed and written successively to cells of the cell arrays.

The Reed-Solomon code is an error correcting code that reckons a plurality of bits as one symbol for error correction in units of symbols. For a read operation, the m-bit data retrieved from the cell arrays are inputted to the decoder. Then, the (n-m) bit data are supplemented with the m-bit data for an information data part thereof for conversion into n-bit data, and a check data part thereof is subjected to m-bit/n-bit conversion into n-bit data, whereby the Reed-Solomon code reckoning n bits as one symbol is reconstituted. Next, the reconstituted Reed-Solomon code is subjected to an error correction process. Then, an m-bit part of the corrected n-bit information data is outputted as the output data.

As described above, the input and the output data are both m-bit data whereas the encoder uses for its encoding operation the Reed-Solomon code reckoning n bits (n>m) as one symbol. Therefore, this makes it possible to extend the code length while maintaining data exchanges with an external entity in units of m bits. For this reason, there is no need to divide information data of a predetermined length into segments for encoding purposes. This makes it possible to reduce check data (redundant data) while preserving the continuity of decoded data.

BEST MODE FOR CARRYING OUT THE INVENTION

Figure 1:
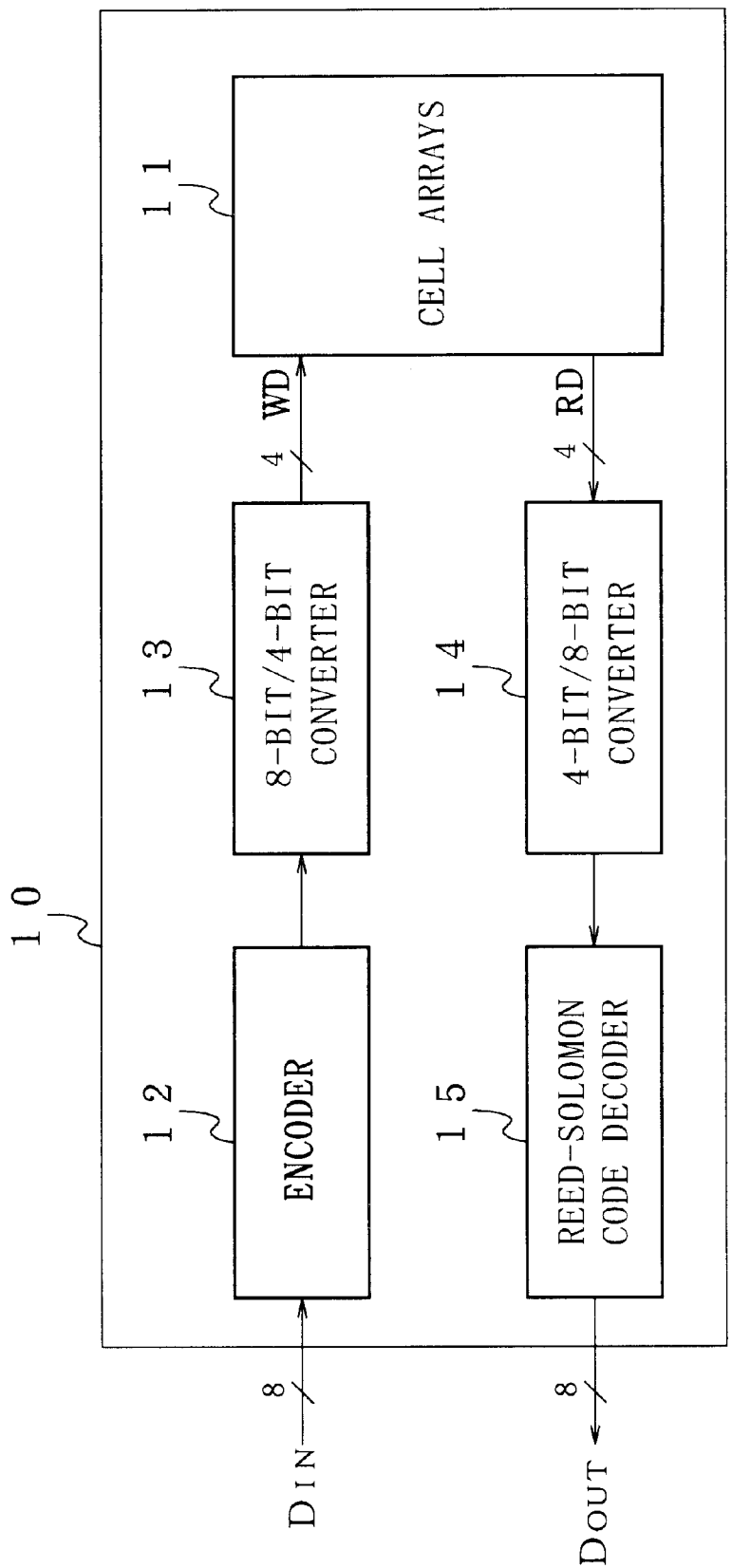
FIG. 1 is a block diagram of a flash memory practiced as a first embodiment of this invention.

FIG. 1 shows a structure of a flash memory 10 practiced as the first embodiment of the invention. The flash memory 10 designed for 16-value (4-bit) recording incorporates an error correcting circuit based on the abbreviated Reed-Solomon code capable of double-error correction. Each of the Reed-Solomon code and the abbreviated Reed-Solomon code reckons a plurality of bits as one byte to correct error in a unit of byte. Details of the Reed-Solomon code are described illustratively in the above-cited publication "Code Theories" by Hideki Imai (Institute of Electronics, Information and Communication Engineers of Japan) among others.

Figure 2:
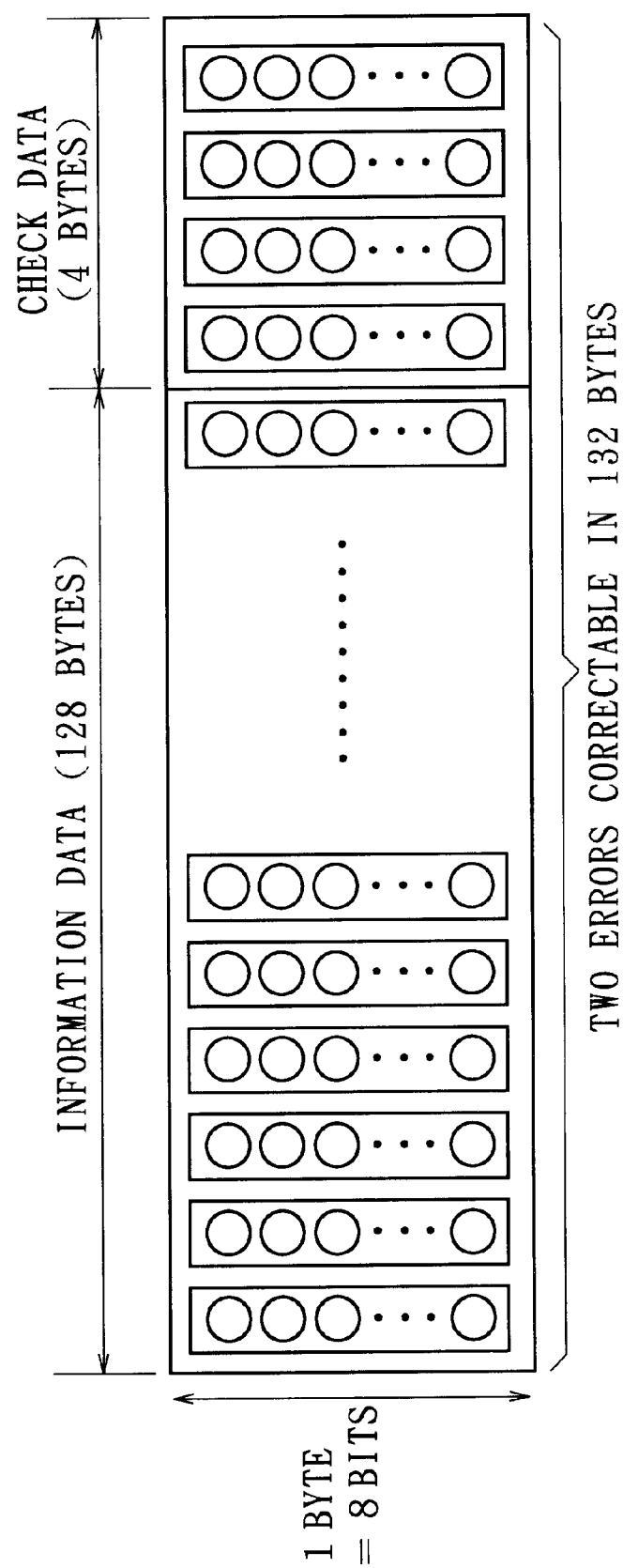
FIG. 2 is a schematic view of a typical abbreviated Reed-Solomon code.

Now, consider an abbreviated Reed-Solomon code reckoning eight bits as one byte to correct two errors in 128-byte information data. In this case, as shown in FIG. 2, check data are made of four bytes and the code as a whole is 132 bytes long (=1056 bits).

Figure 3:
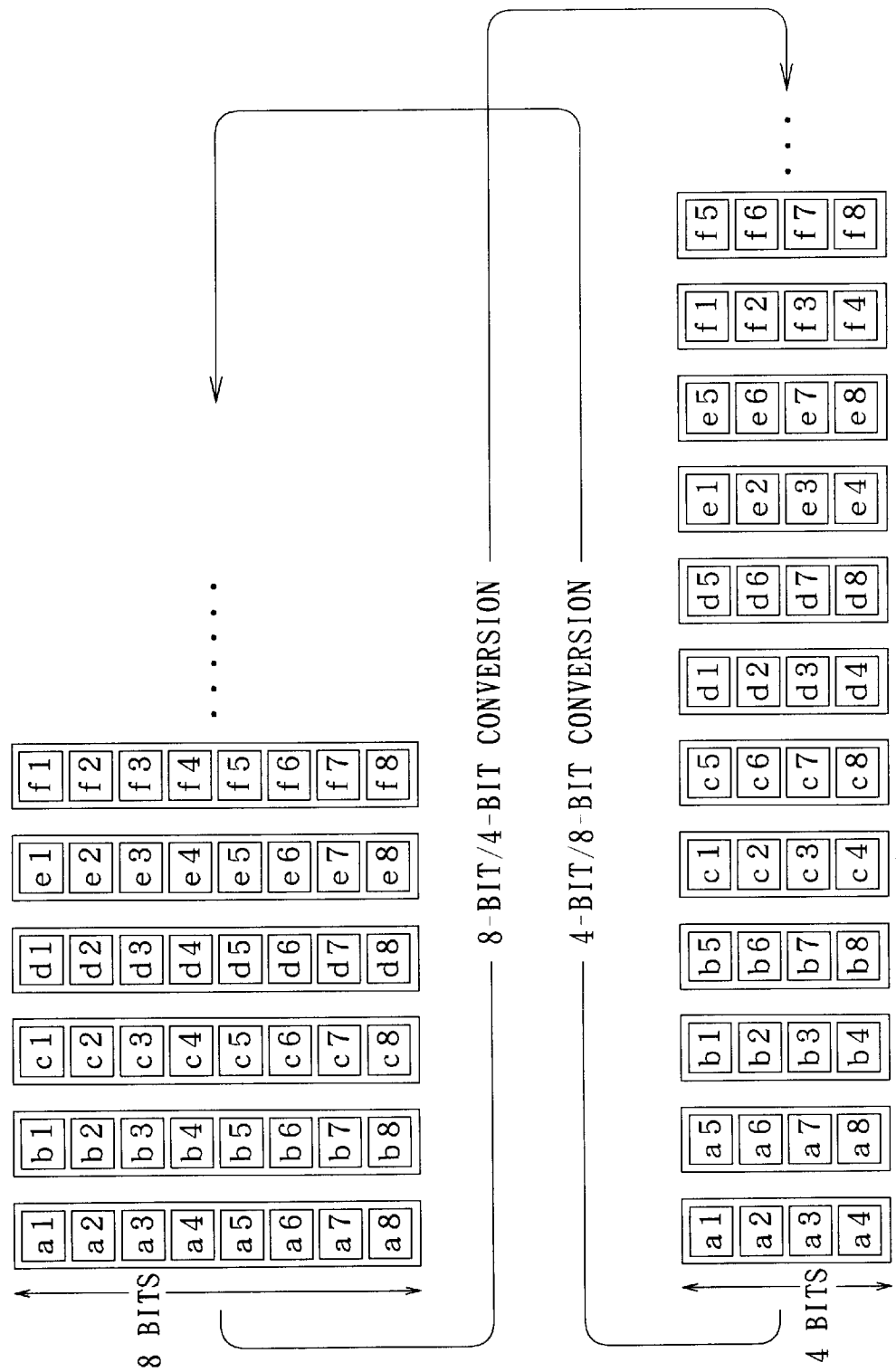
FIG. 3 is an explanatory view showing how bit conversion takes place.

In FIG. 1, the flash memory 10 comprises cell arrays 11 having a plurality of memory cells, an encoder 12 for converting eight-bit parallel input data Din into an abbreviated Reed-Solomon code to provide write data WD to be written to the cell arrays 11 and an eight-bit/four-bit converter 13 for converting one-byte (8-bit) parallel write data WD outputted by the encoder 12 into four-bit parallel data (four-bit data to be stored in memory cell) that are fed to the cell arrays 11, as shown in FIG. 3.

The flash memory 10 further includes a four-bit/eight-bit converter 14 for converting four-bit parallel read data RD retrieved from the cell arrays 11 into one-byte (8-bit) parallel data as shown in FIG. 3, and a Reed-Solomon code decoder 15 for subjecting read data RD converted as one-byte parallel data in the four-bit/eight-bit converter 14 to an error correction process to provide output data Dout. In this structure, the encoder 12 and the Reed-Solomon code decoder 15 constitute an error correcting circuit. Then, the encoder 12 supplements each 128-byte block of input data Din with four-byte check data to generate an abbreviated Reed-Solomon code for correcting two errors in the 128-byte block of information data.

In the flash memory 10 shown in FIG. 1, a data write operation is carried out as follows. That is, eight-bit parallel input data Din are inputted to the encoder 12. Then, the encoder 12 converts the input data Din into an abbreviated Reed-Solomon code for 128 bytes of information data to provide write data WD. The one-byte (8-bit) parallel write data WD outputted by the encoder 12 are converted by the eight-bit/four-bit converter 13 into four-bit parallel data to be fed to the cell arrays 11 so that the converted data are written consecutively to memory cells making up the cell arrays 11.

On the other hand, a data read operation takes place as follows. Four-bit parallel read data RD retrieved from the cell arrays 11 are converted by the four-bit/eight-bit converter 14 into one-byte (8-bit) parallel data that are supplied to the Reed-Solomon code decoder 15. If one code of read data RD has no error, the Reed-Solomon code decoder 15 outputs information data unchanged as output data Dout in units of bytes. If one code of the read data RD has one or two erroneous bytes, the Reed-Solomon code decoder 15 outputs information data as the output data Dout in units of bytes after correcting the error(s).

If the input data Din or output data Dout are not eight-bit parallel data, a bit converter may be furnished upstream of the encoder 12 to convert the input data Din into eight-bit parallel data, or a bit converter may be installed downstream of the Reed-Solomon code decoder 15 to convert the eight-bit parallel data into parallel or serial data representing the output data Dout.

In the first embodiment, the Reed-Solomon code is employed as an error correcting code for correcting errors in units of bytes in the cell arrays 11 made of memory cells each storing four-bit data and then sufficient performance may be attained with a limited number of correcting errors. Therefore, this makes it possible to reduce the error correcting circuit in scale and make smaller a number of memory cells to be used.

Effects of the first embodiment are illustrated below. For purposes of illustration, it is assumed that 65,536 information data cells constitute one block and 1,024 blocks make up a cell array, and that data are written and read to and from the memory in units of blocks. It is also assumed that the probability of a normally fabricated cell becoming faulty (inaccessible) after one million write/erase operations is 0.001% and further, on these assumptions, the probability of a block becoming faulty after one million write/erase operations is compared.

Where the abbreviated BCH code is used for the correction of up to eight erroneous bits in 128 bytes, that is, 1,024-bit information data, 88 bits of check data are needed. Since one defective cell requires the correction of four bits, this error correcting code for eight-error correction permits correction of up to two faulty cells. Since 1,112 bits are stored in 278 cells and one block contains 256 codes, the probability of a block getting faulty is about 0.000091% as calculated by the expression (1) below.

$$1 - \left\{ \sum_{i=0}^{2} {}_{278}C_i (1.0 \times 10^{-5})^i (1 - 1.0 \times 10^{-5})^{278-i} \right\}^{256} \simeq 9.1 \times 10^{-7} \quad (1)$$

Next, the probability of a block becoming faulty is then acquired when the abbreviated Reed-Solomon code for double-error correction is used. In this case, errors of up to two bytes can be corrected. Here, when it is taken into account that a single-cell error will not affect multiple bytes according to the four-bit/eight-bit conversion, the byte error rate is defined by the expression (2) below with eight bits of two-cell information regarded as one byte. Thus, from the ensuing expression (3), the probability of a block getting defective is estimated at about 0.000077%.

$$1 - (1 - 1.0 \times 10^{-5})^2 \simeq 2.0 \times 10^{-5} \quad (2)$$

$$1 - \left\{ \sum_{i=0}^{2} {}_{132}C_i (2.0 \times 10^{-5})^i (1 - 2.0 \times 10^{-5})^{132-i} \right\}^{256} \simeq 7.7 \times 10^{-7} \quad (3)$$

Therefore, it will be appreciated that the abbreviated BCH code for eight-error correction and the abbreviated Reed-Solomon code for two-error correction have approximately the same error correcting capability. However, since two errors for correction by the Reed-Solomon code are much smaller opposed to eight errors for correction by the BCH code, use of Reed-Solomon code allows a scale of error correcting circuit to be composed as a far smaller one than that of BHC code. In addition, since 32 bits of redundant data for the Reed-Solomon code are much smaller with compared with 88 bits of redundant data for the BCH code, a far smaller number of memory cells can be used therefor.

Figure 4:
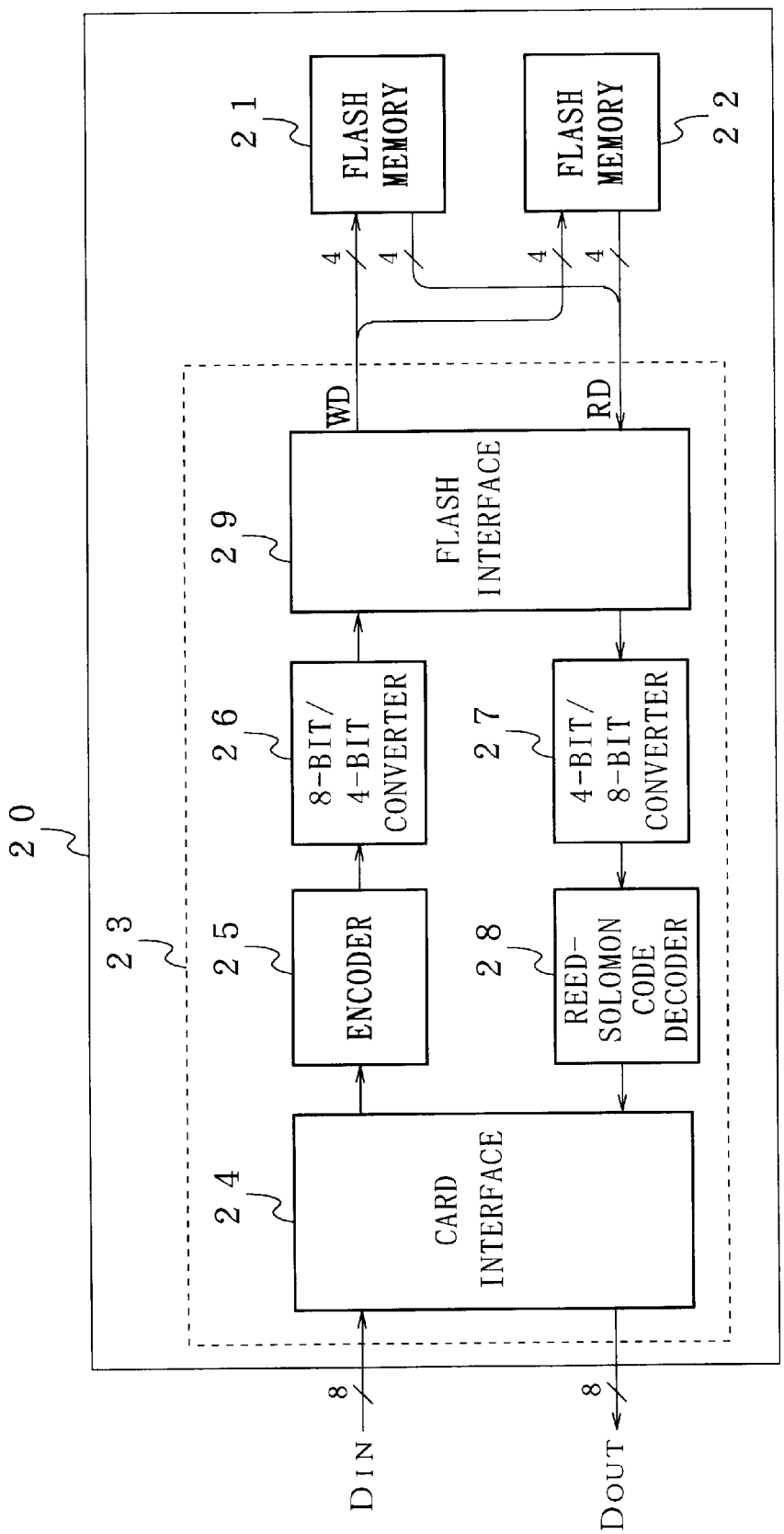
FIG. 4 is a block diagram of a memory card practiced as a second embodiment of the invention.

Next, the second embodiment of this invention will now be described. FIG. 4 depicts a structure of a memory card 20 practiced as the second embodiment of the invention. The memory card 20 comprises two flash memories for 16-value (4-bit) recording and a controller incorporating an error correcting circuit based on the abbreviated Reed-Solomon code for double-error correction.

As shown in FIG. 4, the memory card 20 includes two flash memories 21 and 22 as well as a controller 23 for writing and reading data to and from the flash memories 21 and 22.

Further, the controller 23 has a card interface 24 for exchanging data with an entity outside the card, an encoder 25 for converting eight-bit parallel input data Din into an abbreviated Reed-Solomon code to provide write data WD to be written to the flash memories 21 and 22, and an eight-bit/four-bit converter 26 for converting the write data WD of one-byte (8-bit) parallel data outputted by the encoder 25 into four-bit parallel data (four-bit data to be stored in memory cells) as depicted in FIG. 3.

The controller 23 further comprises a four-bit/eight-bit converter 27 for converting four-bit parallel read data RD retrieved from the flash memory 21 or 22 into one-byte (8-bit) parallel data as shown in FIG. 3, a Reed-Solomon code decoder 28 for subjecting to an error correction process the one-byte parallel read data RD converted in the four-bit/eight-bit converter 27 to provide output data Dout, and a flash interface 29 for controlling the writing and reading of data to and from the flash memories 21 and 22.

In the above structure, the encoder 25 and the Reed-Solomon code decoder 28 constitute an error correcting circuit. Then, the encoder 25 supplements each 128-byte block of input data Din with four-byte check data to generate an abbreviated Reed-Solomon code for correcting two errors in the 128-byte information data.

In the memory card 20 shown in FIG. 4, a data write operation is carried out as follows. That is, input data Din is taken into the card through the card interface 24 and sent to the encoder 25. The encoder 25 converts the input data Din into an abbreviated Reed-Solomon code for 128 bytes of information data to provide write data WD. Then, the eight-bit/four-bit converter 26 converts the one-byte (8-bit) parallel write data WD outputted by the encoder 25 into four-bit parallel data. The converted four-bit parallel data are written to the flash memory 21 or the flash memory 22 under control of the flash interface 29.

On the other hand, a data read operation takes place as follows. Four-bit parallel read data RD retrieved from the flash memory 21 or the flash memory 22 under control of the flash interface 29 are converted by the four-bit/eight-bit converter 27 into one-byte (8-bit) parallel data. The converted one-byte parallel data are fed to the Reed-Solomon code decoder 28. If one code of read data RD has no error, the Reed-Solomon code decoder 28 outputs information data unchanged as output data Dout in units of bytes. If one code of the read data RD has one or two erroneous bytes, the Reed-Solomon code decoder 28 outputs information data as the output data Dout in units of bytes after correcting the error(s). In this way, the output data Dout outputted by the Reed-Solomon code decoder 28 are sent out of the card through the card interface 24.

If the input data Din or output data Dout are not eight-bit parallel data, a bit converter may be furnished upstream of the encoder 25 to convert the input data Din into eight-bit parallel data, or a bit converter may be installed downstream of the Reed-Solomon code decoder 28 to convert the eight-bit parallel data into parallel or serial data representing the output data Dout.

As described, in the second embodiment, the Reed-Solomon code is employed as the error correcting code for error correction in units of bytes in the flash memories 21 and 22, which constitute a memory portion, made of cell arrays comprising memory cells each storing four-bit data. As with the first embodiment, the second embodiment provides sufficient performance involving a limited number of errors to be corrected. Accordingly, the second embodiment also makes it possible to reduce the error correcting circuit in scale with a smaller number of memory cells incorporated. Further, since the controller 23 corrects errors, the error correcting circuit is allowed to be larger in scale than if the error correcting circuit is incorporated in the flash memory 21 or 22. Therefore, even if a large number of errors result from multi-value recording, they can be corrected.

Figure 5:
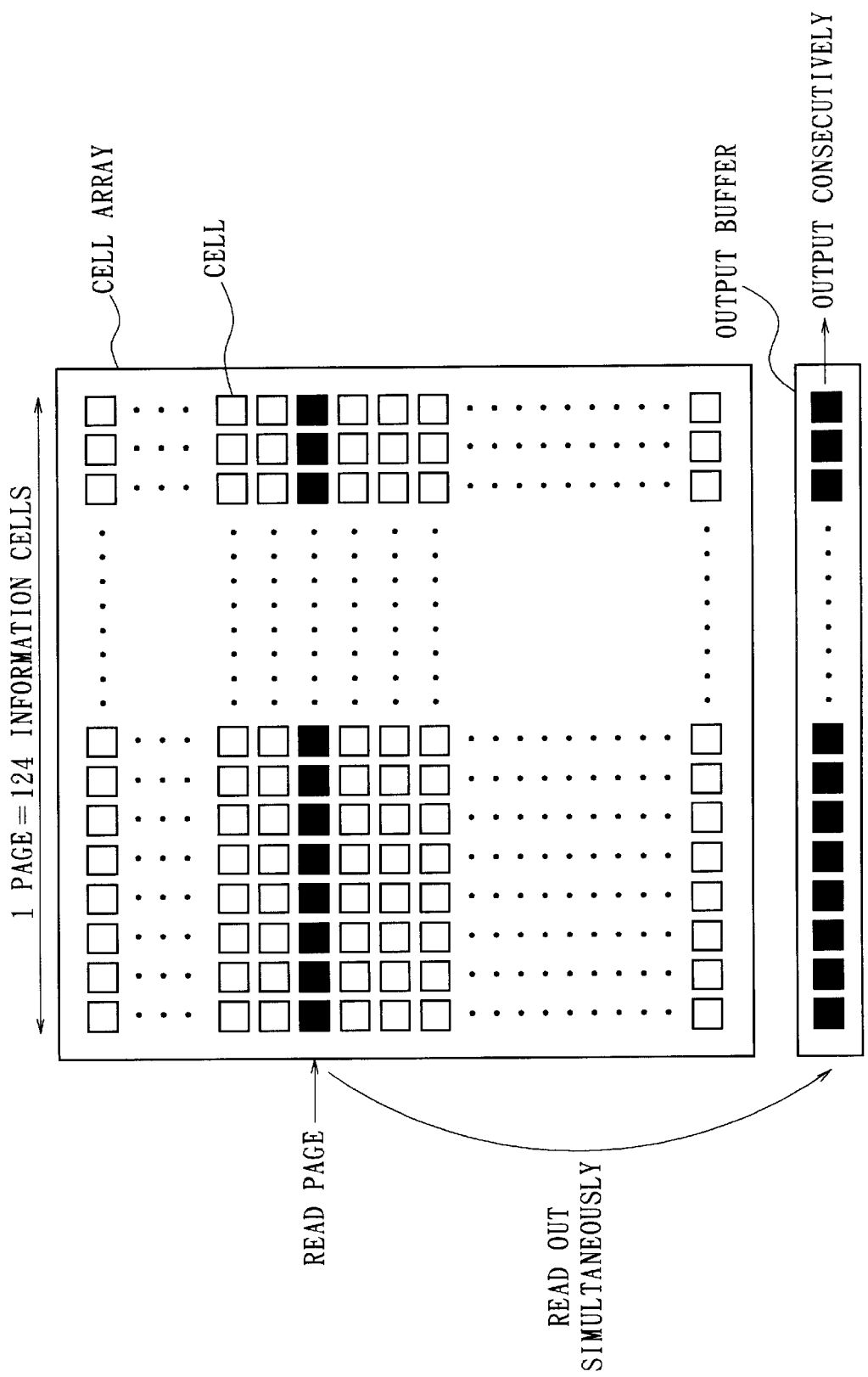
FIG. 5 is an explanatory view depicting how data are read from a cell array.
Figure 16:
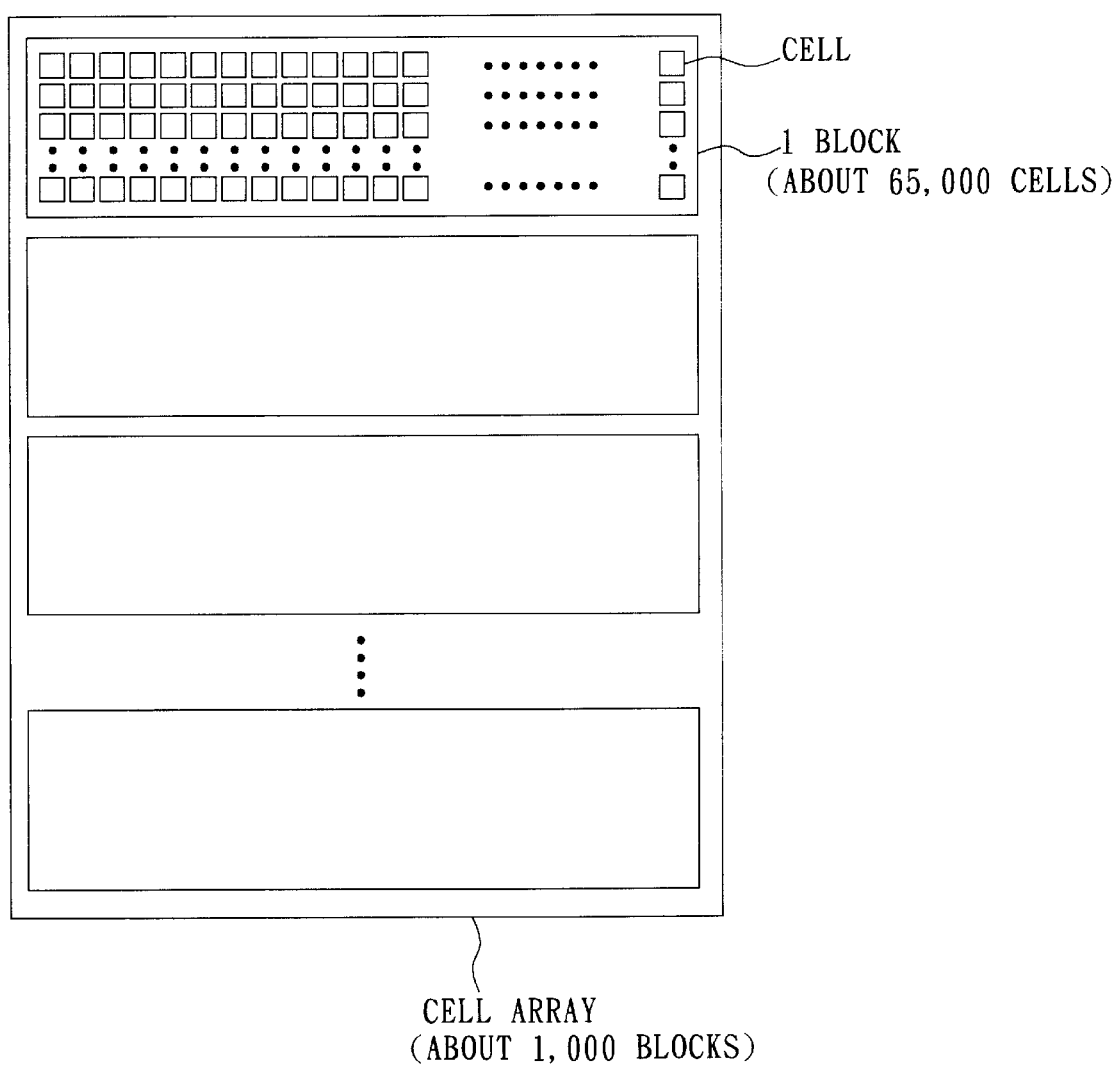
FIG. 16 is a schematic view showing a structure of a cell array.
Figure 17B:
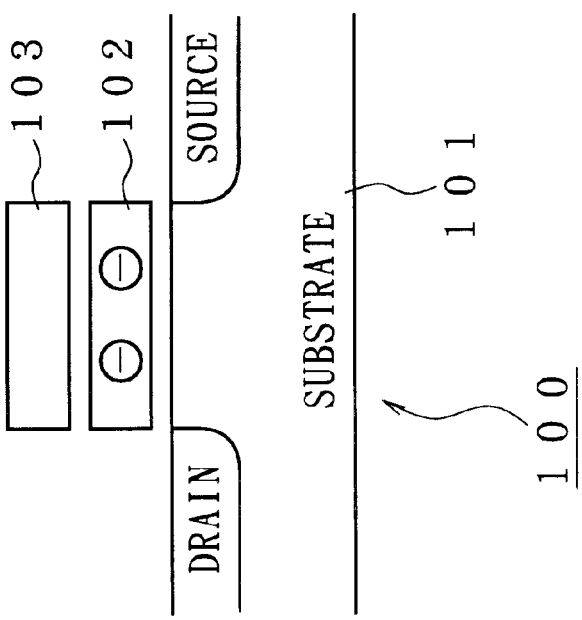
FIGS. 17A and 17B are schematic views showing a structure of a memory cell.
Figure 17A:
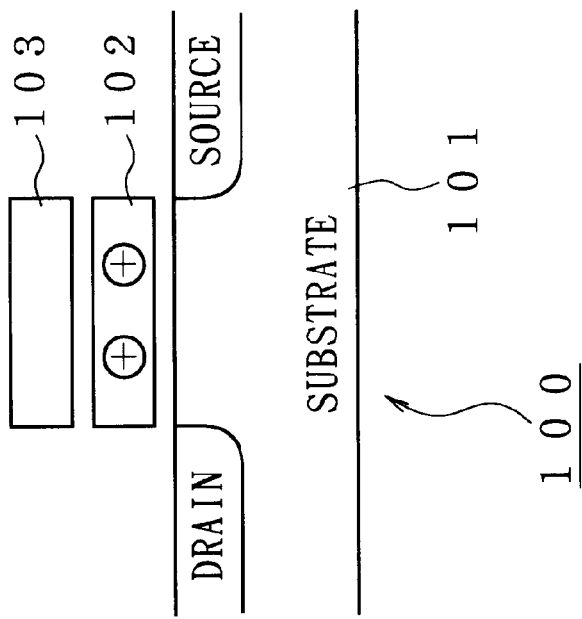
Figure 18:
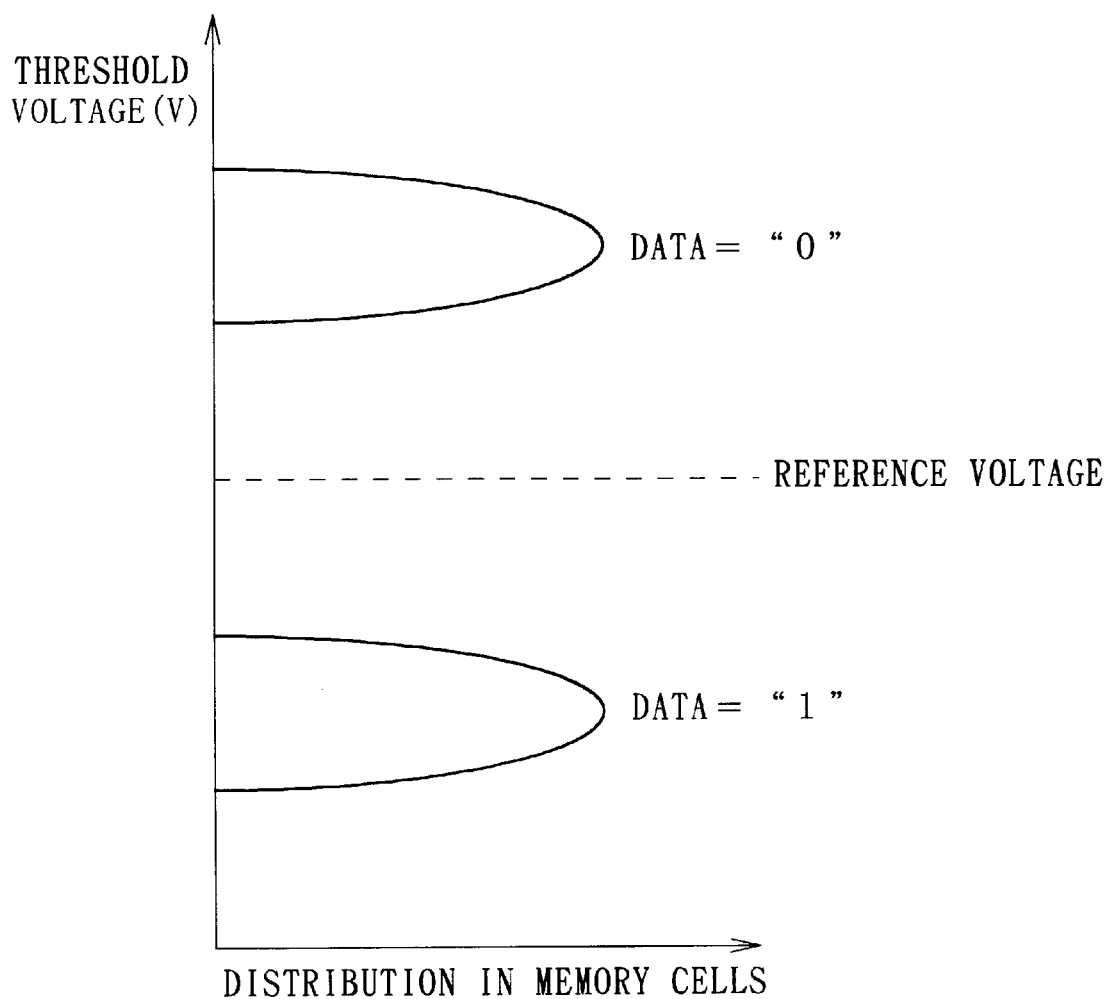
FIG. 18 is a graphic representation showing voltage distribution in memory cells.
Figure 19:
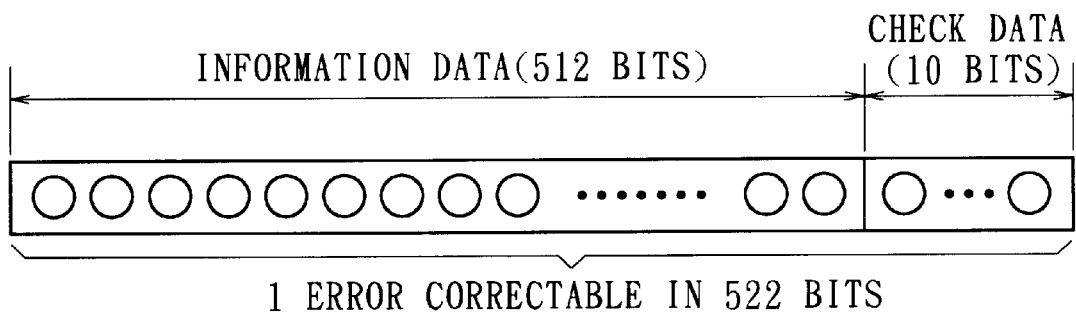
FIG. 19 is a schematic view of a typical abbreviated Hamming code.
Figure 20:
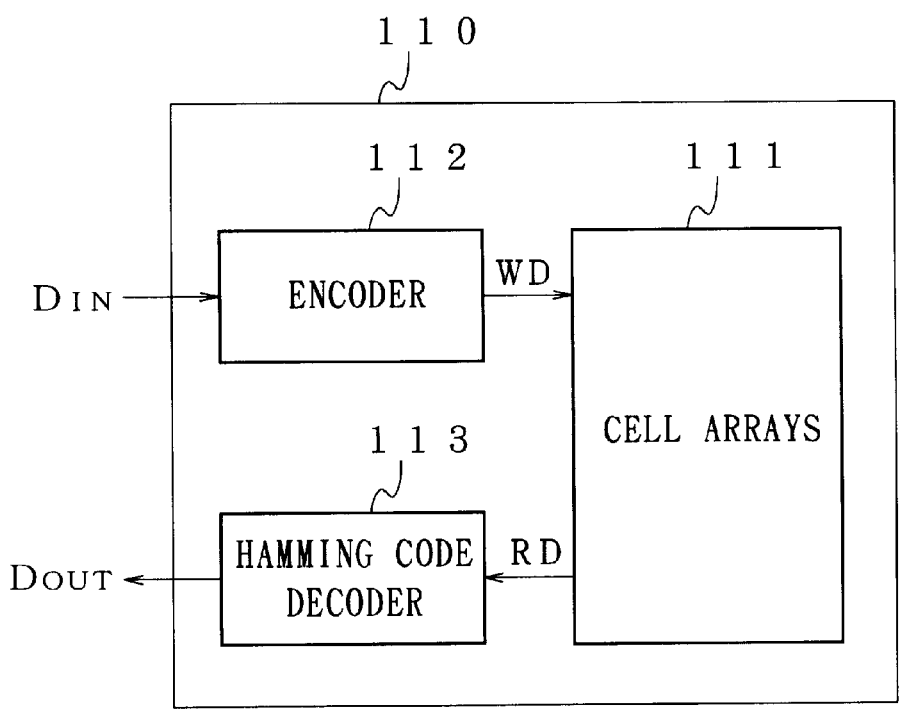
FIG. 20 is a block diagram showing a structure of a flash memory incorporating an error correcting circuit based on the abbreviated Hamming code.
Figure 21:
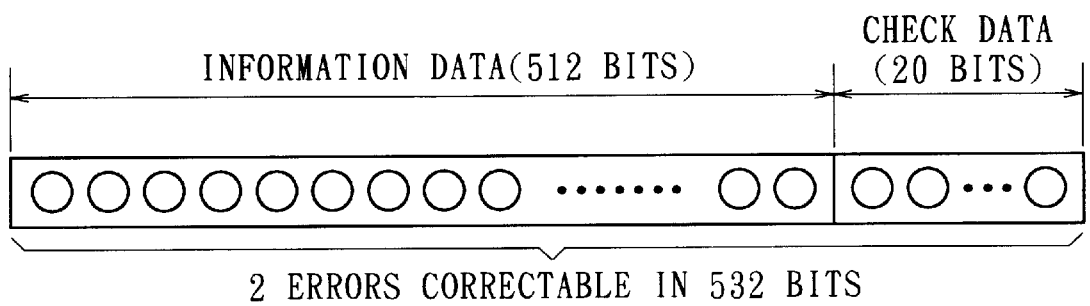
FIG. 21 is a schematic view of a typical abbreviated BCH code.
Figure 22:
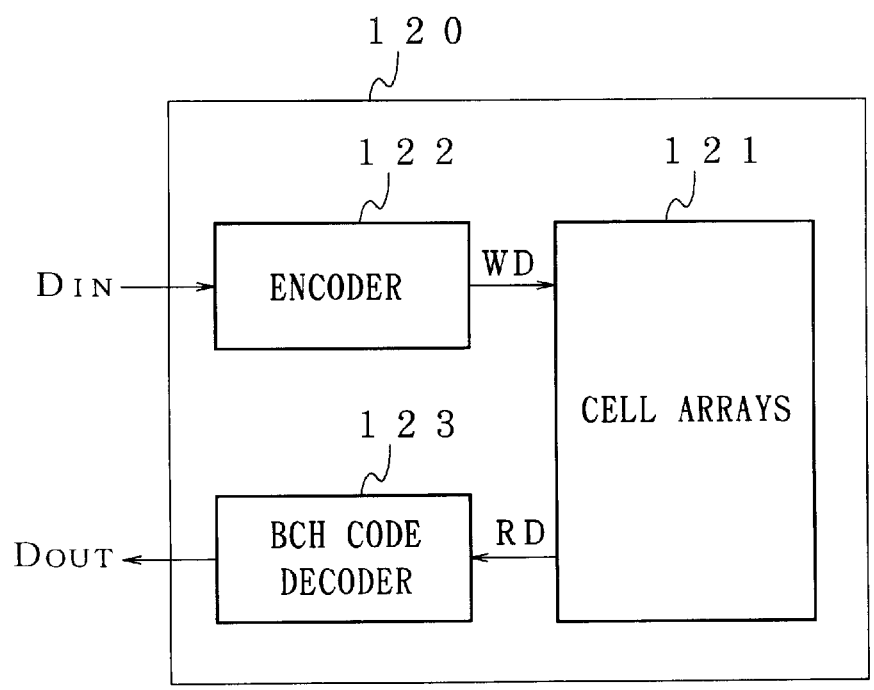
FIG. 22 is a block diagram showing a structure of a flash memory incorporating an error correcting circuit based on the BCH code.
Figure 23:
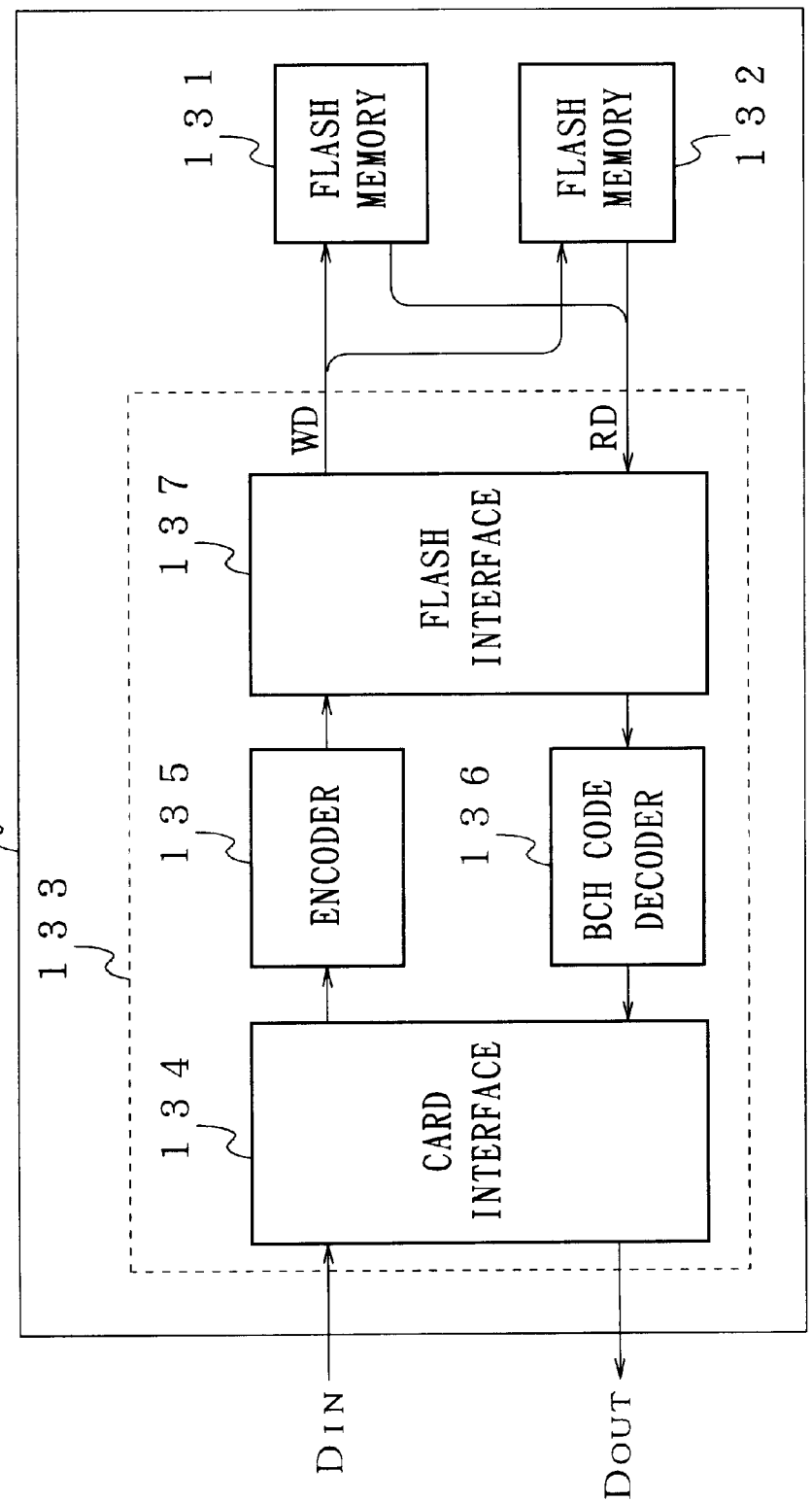
FIG. 23 is a block diagram showing a structure of a memory card with a controller incorporating an error correcting circuit based on the abbreviated BCH code.
Figure 24A:
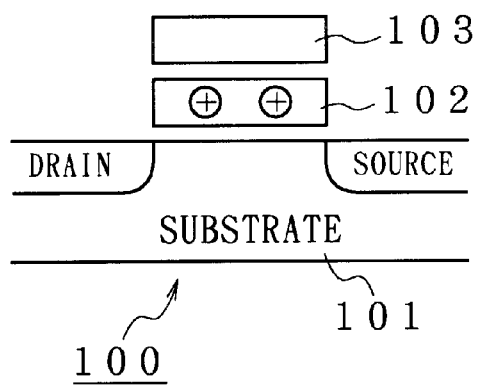
FIGS. 24A through 24D are schematic views showing how a memory cell is electrically charged for multi-value recording.
Figure 24B:
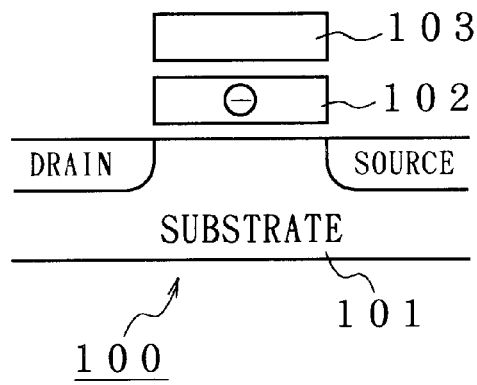
Figure 24C:
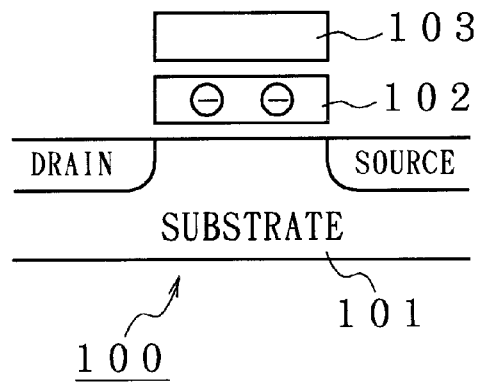
Figure 24D:
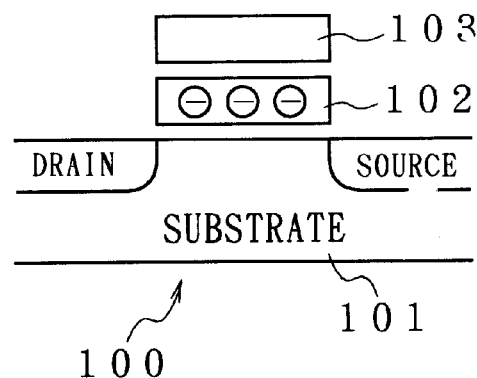
Figure 25:
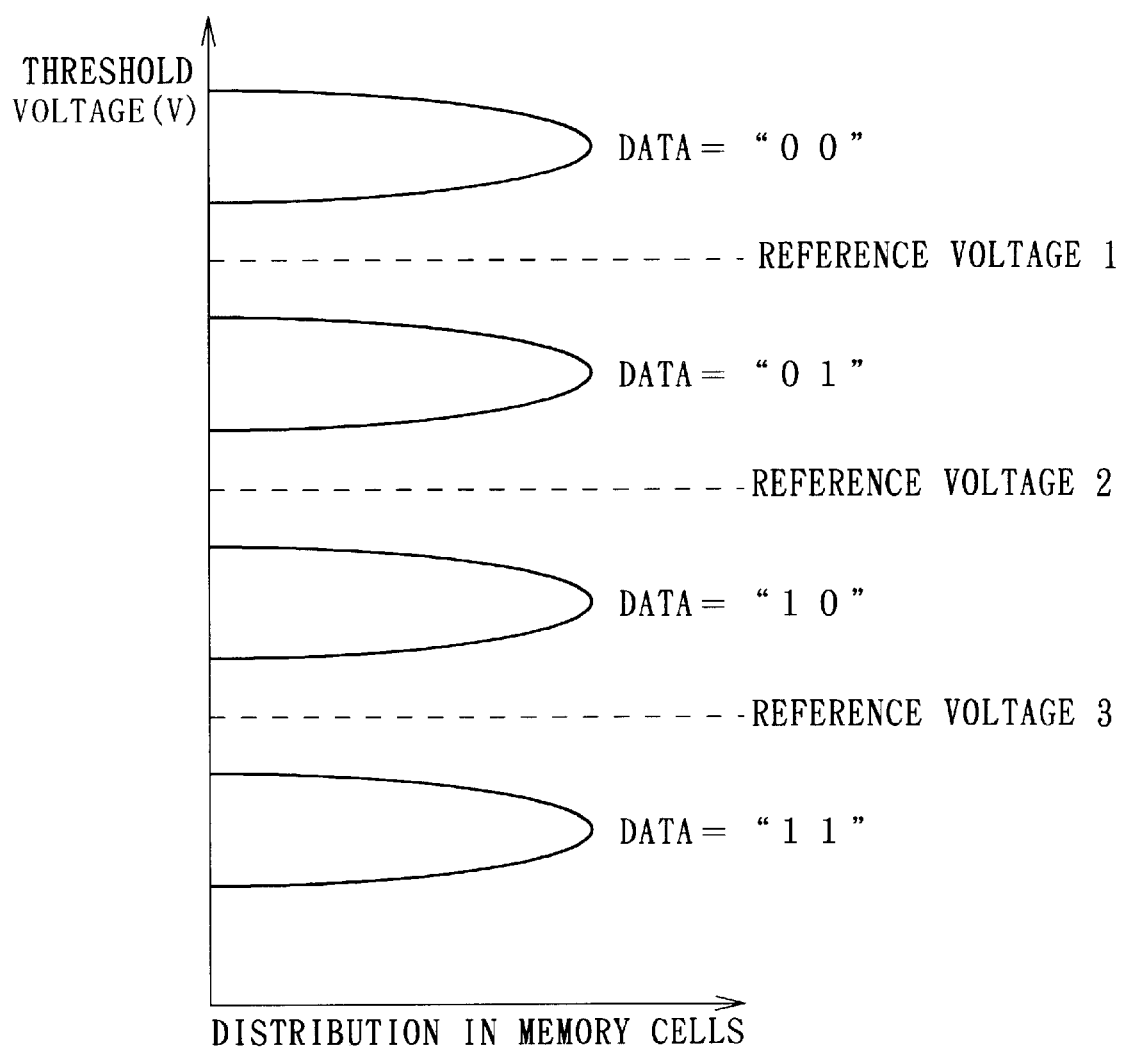
FIG. 25 is a graphic representation illustrating voltage distribution in memory cells for multi-value recording.
Figure 26:
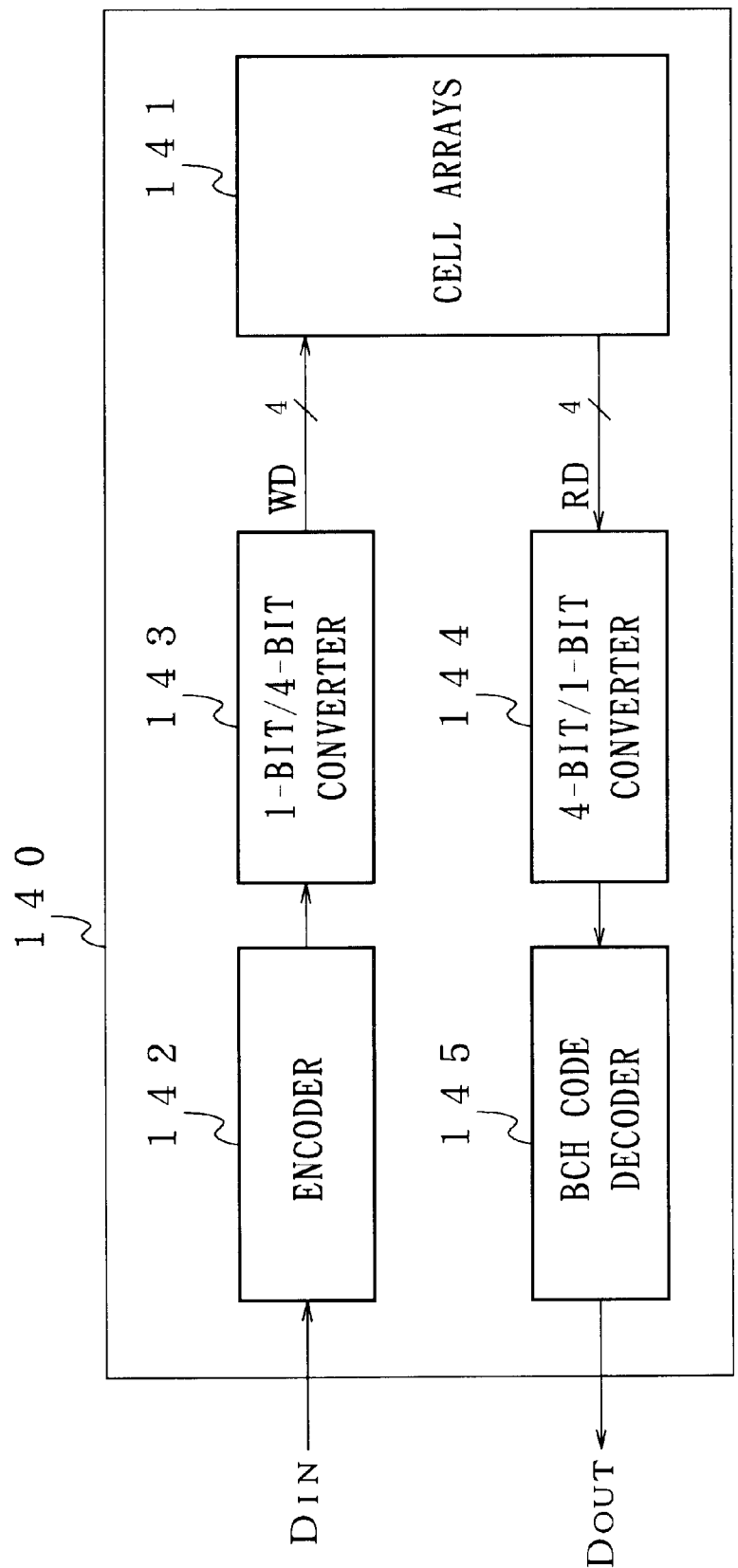
FIG. 26 is a block diagram showing a structure of a multi-value recording flash memory incorporating an error correcting circuit based on the abbreviated BCH code.

Here, the process of reading data from a flash memory is recapitulated below. Data are read not in units of cells but in units called pages (e.g., each page representing 1,024 cells) simultaneously from cell arrays (see FIG. 16). The read data are outputted consecutively from an output buffer (see FIG. 5). Therefore, for example, from a 16-value recording flash memory where one page represents 1,024 cells of information, 4,096 bits (512 bytes) of information are retrieved as a unit. Since data exchanges with an entity outside the memory are carried out mostly in units of bytes (8 bits), one symbol of the Reed-Solomon code should preferably be eight bits long so as to ensure consistency.

Figure 6:
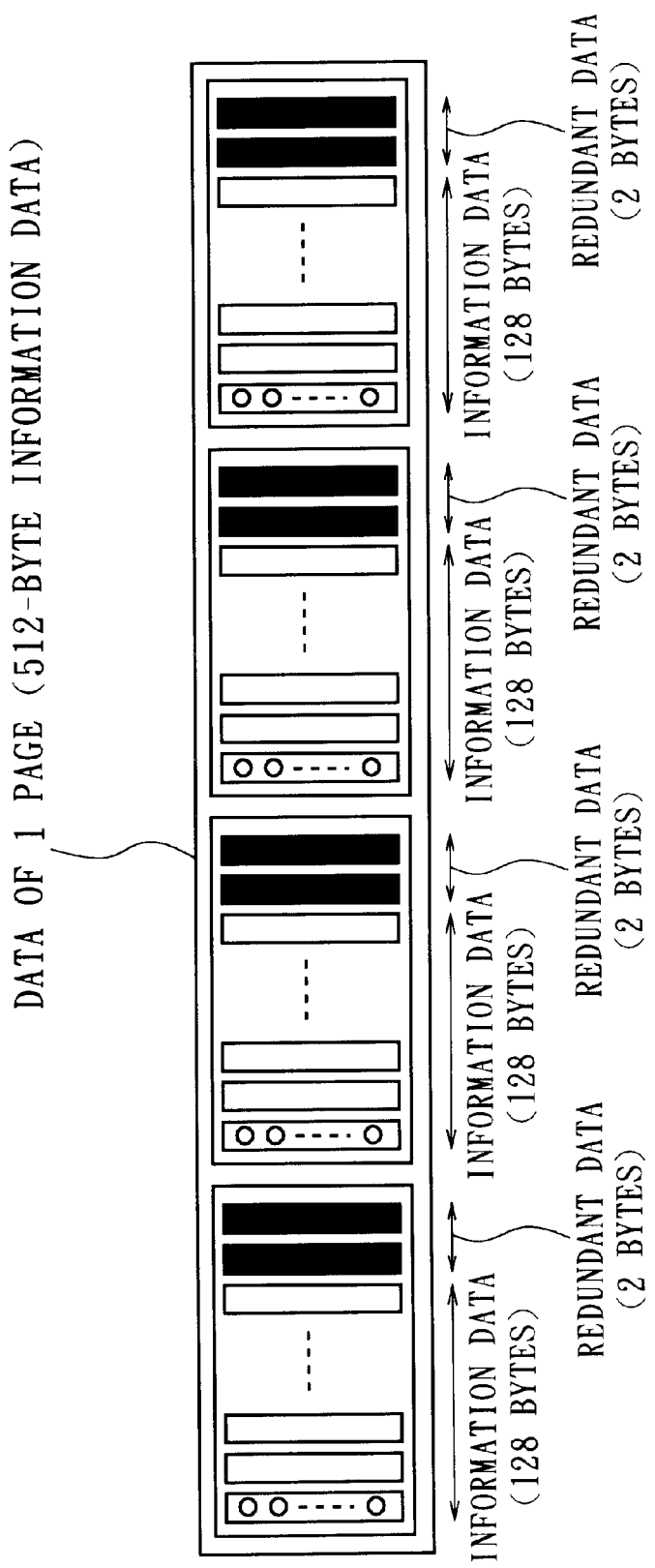
FIG. 6 is a schematic view of four abbreviated Reed-Solomon codes permitting correction of one error in 512-byte information data.

However, the Reed-Solomon code reckoning eight bits as one symbol has a code length of 255 bytes and then, this makes it necessary upon encoding to divide 512-byte data into three or four segments each supplemented with check data (redundant data). FIG. 6 shows a state of coding wherein 512-byte data are encoded illustratively by four abbreviated Reed-Solomon codes each capable of correcting one error in 128 bytes of information data.

As a general characteristic of the error correcting code, performance is better when information data as a whole are encoded, if supplemented with same number of check data, than when the same information data are segmented before being coded. Where 512 bytes of information data are to be read out simultaneously, efficiency is higher if all 512-byte information data are encoded as a whole.

Figure 7:
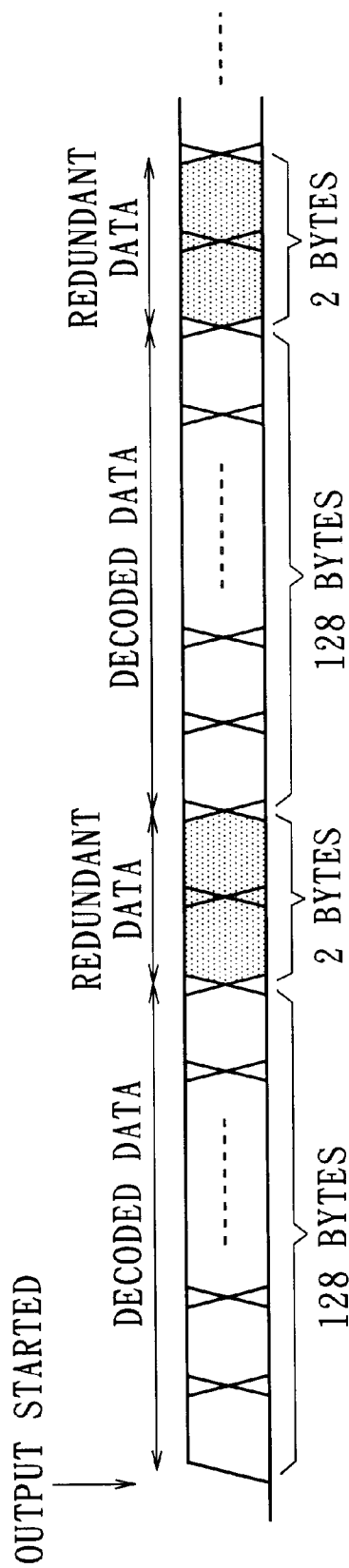
FIG. 7 is an explanatory view illustrating the continuity of decoded data.

Further, if data of one page are divided into segments when encoded, the decoded data are outputted with intervening blanks when decoded (see FIG. 7). From a system performance point of view, decoded data of one page should be outputted uninterrupted as much as possible. Therefore, in that respect, it is also preferable for data of one page to be encoded as one block.

Figure 8:
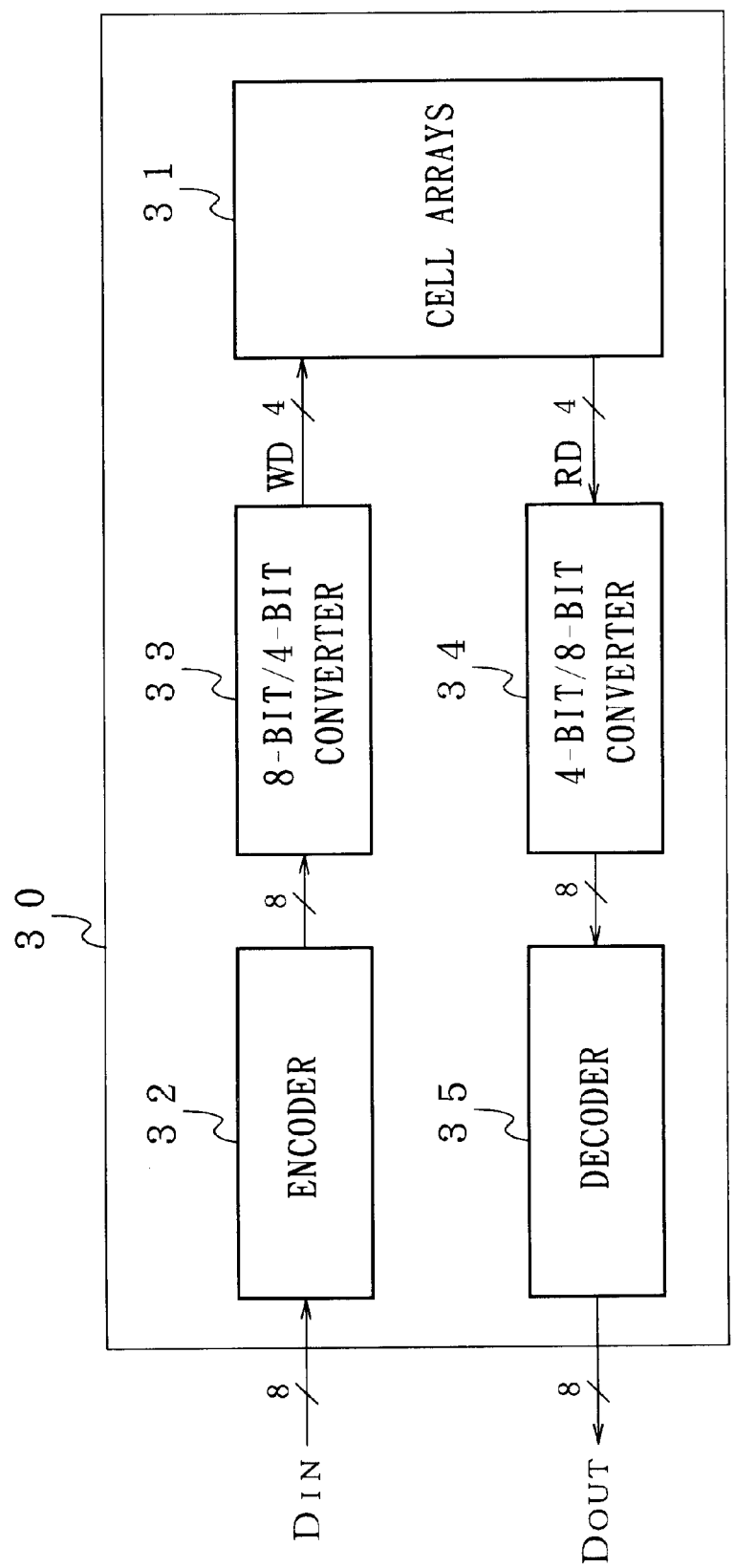
FIG. 8 is a block diagram of a structure of flash memory practiced as a third embodiment of the invention.

Next, the third embodiment of this invention will be described. FIG. 8 shows a structure of a flash memory 30 practiced as the third embodiment of the invention. The flash memory 30 permits data exchanges with an outside entity in units of bytes (8 bits). This flash memory 30 for 16-value (4-bit) recording incorporates an error correcting circuit based on the abbreviated Reed-Solomon code capable of double-error correction.

In this case, since information data, e.g., 512 bytes, in each page are encoded as one block, encoding is performed using the abbreviated Reed-Solomon code reckoning 10 bits as one symbol. Here, if information data of one page are made of 512 bytes, the check data (redundant data) for double-error correction comprise four symbols requiring a 516-byte code length. Since the Reed-Solomon code reckoning 10 bits as one symbol is 1,023 bytes long, the 516-byte-long code is made available through abbreviation. Further, the check data comprising four symbols amounts to 40 bits representing five bytes.

As shown in FIG. 8, the flash memory 30 includes cell arrays 31 having a plurality of memory cells, an encoder 32 for converting eight-bit parallel input data Din into an abbreviated Reed-Solomon code to provide write data WD to be written to the cell arrays 31, and an eight-bit/four-bit converter 33 for converting eight-bit write data WD outputted by the encoder 32 into four-bit data (four-bit data to be stored in memory cells) that are supplied to the cell arrays 31, as shown in FIG. 3.

Further, the flash memory 30 comprises a four-bit/eight-bit converter 34 for converting four-bit read data RD retrieved from the cell arrays 31 into eight-bit data as shown in FIG. 3, and a decoder 35 for subjecting to an error correction process the eight-bit read data RD converted in the four-bit/eight-bit converter 34 to provide output data Dout. In this structure, the encoder 32 and the decoder 35 constitute an error correcting circuit.

Figure 9:
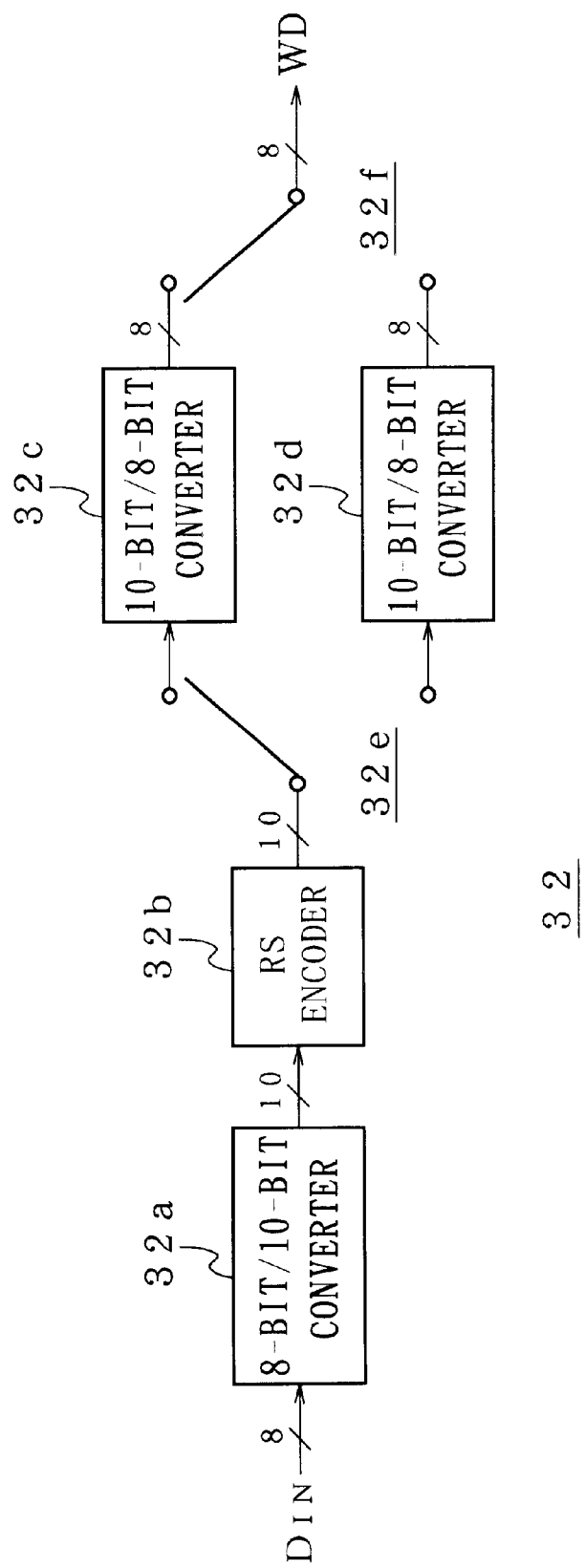
FIG. 9 is a block diagram of a structure of an encoder in the flash memory.
Figure 10:
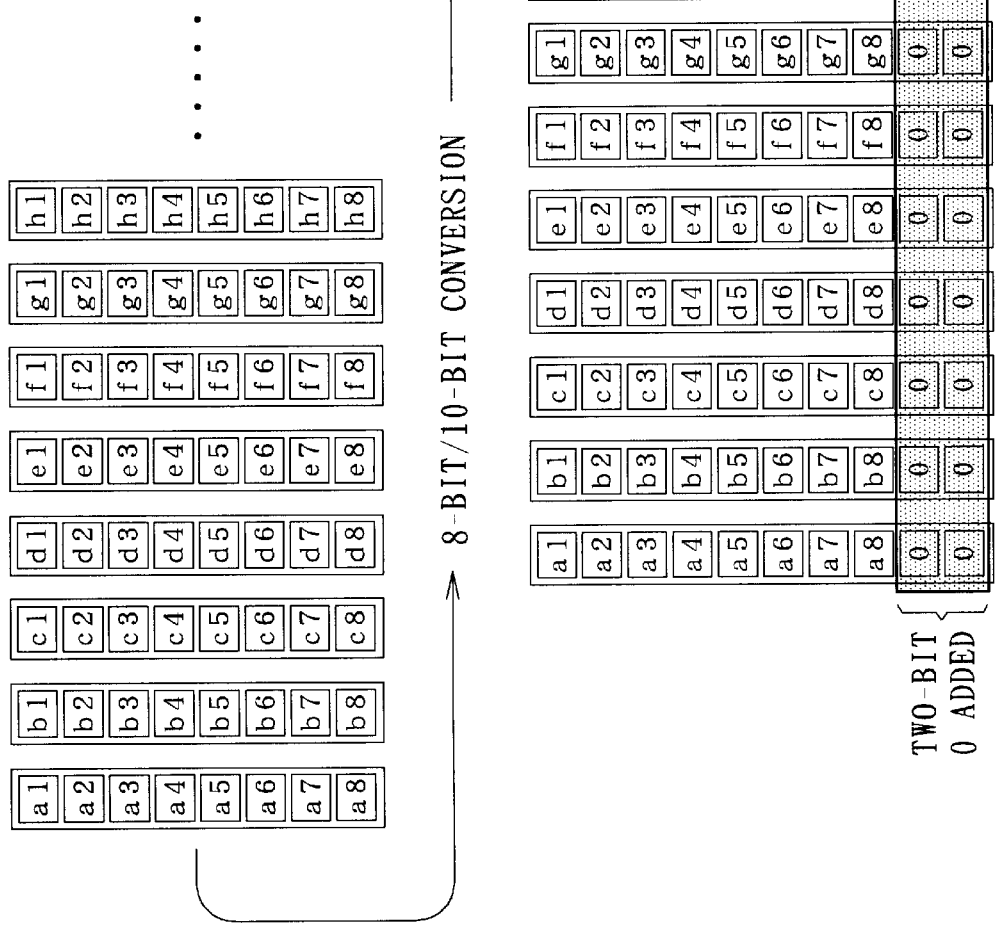
FIG. 10 is an explanatory view depicting an operation of eight-bit/10-bit conversion of an information data part upon encoding and decoding.

FIG. 9 shows a structure of the encoder 32. The encoder 32 includes an eight-bit/10-bit converter 32a for converting eight-bit data as input data Din into 10-bit data by supplementing them with two-bit zeros as shown in FIG. 10, and a Reed-Solomon encoder 32b for encoding 10-bit data outputted by the converter 32a by use of the Reed-Solomon code reckoning 10 bits as one symbol. The Reed-Solomon encoder 32b supplements each 512-symbol block of 10-bit data with four-symbol check data (redundant data) to generate an abbreviated Reed-Solomon code capable of correcting two errors in 512 symbols.

Figure 11:
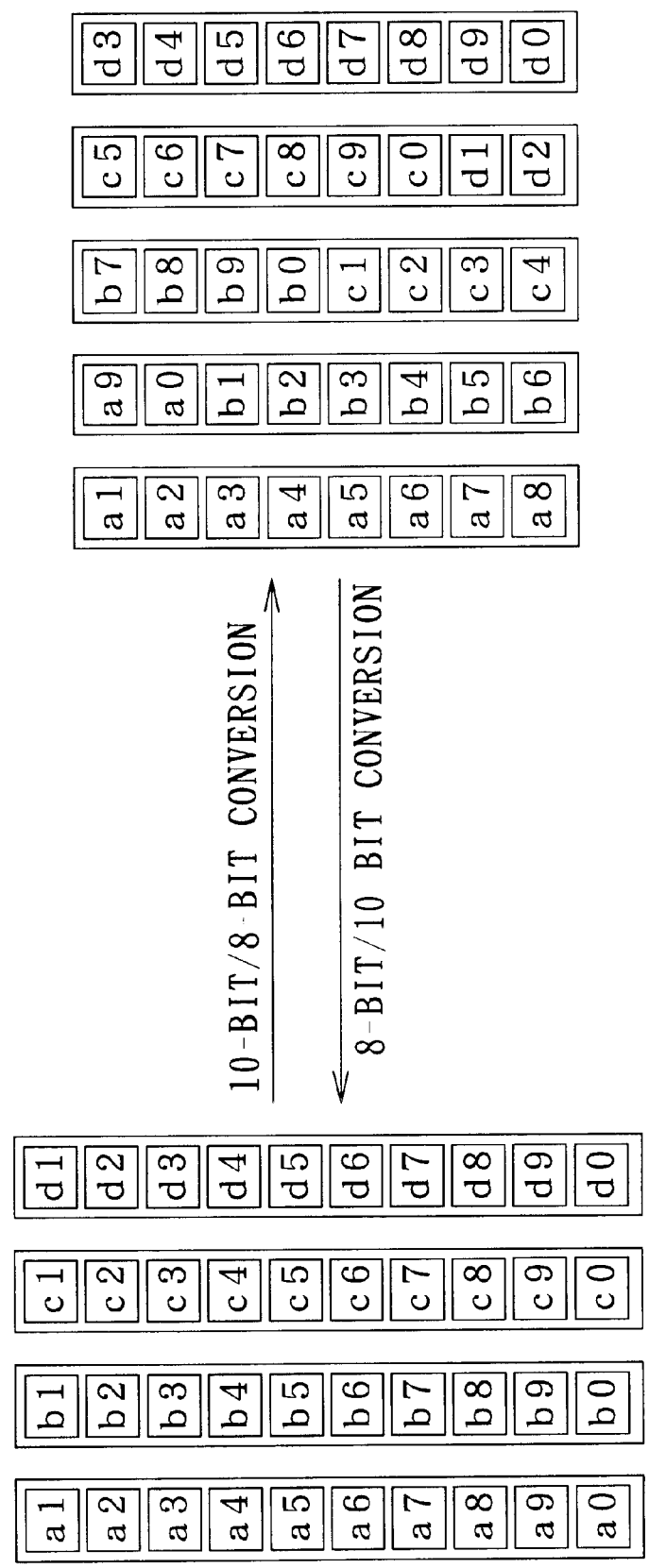
FIG. 11 is an explanatory view showing an operation of eight-bit/10-bit conversion of a check data part upon encoding and decoding.

Further, the encoder 32 comprises a 10-bit/eight-bit converter 32c for removing two bits from 10-bit data for conversion into eight-bit data, a 10-bit/eight-bit converter 32d for changing the bit configuration of 10-bit data for conversion into eight-bit data as shown in FIG. 11, a changeover switch 32e for selectively supplying to the converters 32c and 32d the 512-symbol information data and four-symbol check data constituting each Reed-Solomon code outputted by the Reed-Solomon encoder 32b, and a changeover switch 32f for selectively outputting as write data WD the eight-bit data corresponding to the 512-symbol information data from the converter 32c and the eight-bit data corresponding to the four-symbol check data from the converter 32d. When supplied with the 512-symbol information data, the converter 32c outputs 512-byte data making up an information data part. On the other hand, when supplied with the four-symbol check data, the converter 32d outputs five-byte data forming a check data part.

Operation of the encoder 32 of the above-described constitution will be described. Eight-bit input data Din of eight-bit data are fed to the eight-bit/10-bit converter 32a wherein the eight-bit data are supplemented with two-bit zeros for conversion into 10-bit data. Then, such the 10-bit data are supplied to the Reed-Solomon encoder 32b and converted into an abbreviated Reed-Solomon code for correcting two errors in the 512-symbol information data.

Of each 516-symbol Reed-Solomon code from the Reed-Solomon encoder 32b, the 512-symbol information data are sent to the 10-bit/eight-bit converter 32c, through the changeover switch 32e, wherein the two-bit zeros added by above-described eight-bit/10-bit converter 32a are removed from the supplied 10-bit data for conversion into eight-bit data (see FIG. 10). Then, the resulting eight-bit data are outputted as write data WD via the changeover switch 32f.

On the other hand, of each 516-symbol Reed-Solomon code outputted from the Reed-Solomon encoder 32b, the four-symbol check data are fed to the 10-bit/eight-bit converter 32d, through the changeover switch 32e, wherein the bit configuration of the check data is changed for conversion into eight-bit data (see FIG. 11). Then, the converted eight-bit data are outputted as write data WD via the changeover switch 32f.

Figure 12:
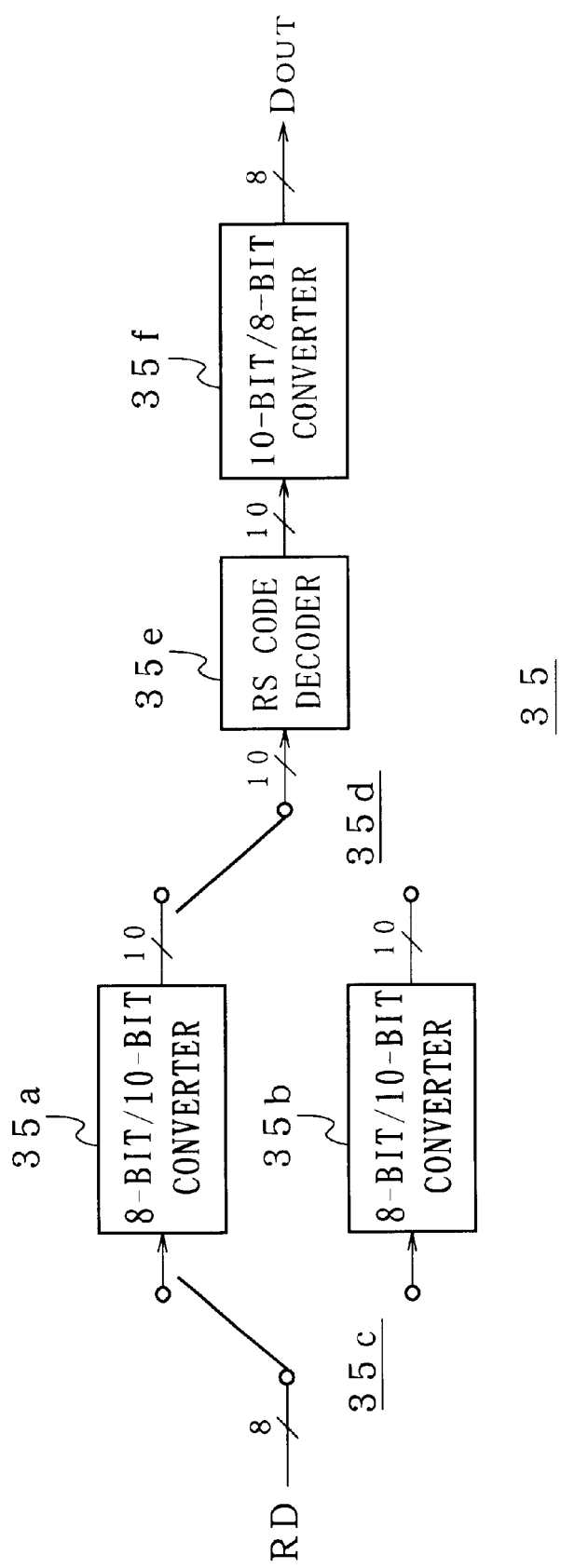
FIG. 12 is a block diagram showing a structure of a decoder in the flash memory.

FIG. 12 shows a structure of the decoder 35. The decoder 35 comprises an eight-bit/10-bit converter 35a for supplementing eight-bit data with two-bit zeros for conversion into 10-bit data as shown in FIG. 10, an eight-bit/10-bit converter 35b for changing the bit configuration of eight-bit data for conversion into 10-bit data as shown in FIG. 11, a changeover switch 35c for selectively supplying each 512-byte information data part and each five-byte check data part of eight-bit read data RD outputted from the four-bit/eight-bit converter 34 (in FIG. 8) to the converters 35a and 35b, and a changeover switch 35d for selectively extracting the 10-bit data corresponding to the 512-byte information data part outputted by the converter 35a and the 10-bit data corresponding to the five-byte check data part outputted by the converter 35b so as to reconstitute the abbreviated Reed-Solomon code for correcting two errors in the 512-symbol information data.

Figure 13:
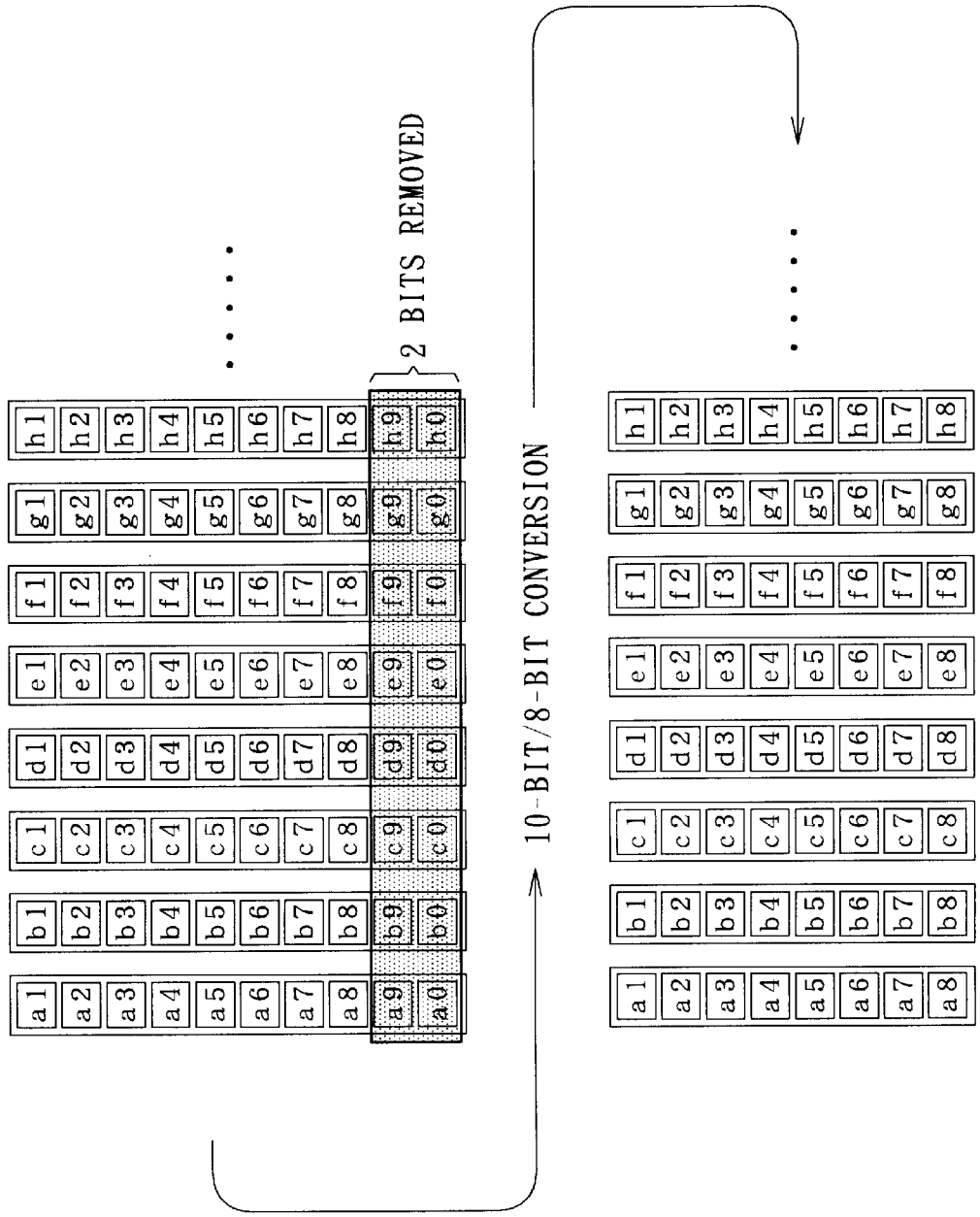
FIG. 13 is an explanatory view illustrating an operation of 10-bit/eight-bit conversion upon decoding.

Further, the decoder 35 includes a Reed-Solomon code decoder 35e for subjecting to an error correction process the Reed-Solomon code outputted by the changeover switch 35d, and a 10-bit/eight-bit converter 35f for removing two bits from the 10-bit information data having undergone error correction by the decoder 35e, for conversion into eight-bit data to provide output data Dout, as shown in FIG. 13.

Operation of the decoder 35 of the above-described constitution will be described. Of the eight-bit data provided as the read data RD, each 512-byte information data part is supplied to the eight-bit/10-bit converter 35a wherein two-bit zeros are added to the supplied data for conversion into 10-bit data (see FIG. 10). On the other hand, of the eight-bit data furnished as the read data RD, each five-byte check data part is supplied to the eight-bit/10-bit converter 35b wherein the bit configuration of the supplied data is changed for conversion into 10-bit data (see FIG. 11).

Then, the changeover switch 35d selectively extracts the 10-bit data corresponding to the 512-byte information data part outputted by the converter 35a and the 10-bit data corresponding to the five-byte check data part outputted by the converter 35b, so that the abbreviated Reed-Solomon code for correcting two errors in the 512-symbol information data may be reconstituted.

Further, the Reed-Solomon code outputted by the changeover switch 35d is supplied to the Reed-Solomon code decoder 35e. If one code contains one or two erroneous symbols, the Reed-Solomon code decoder 35e corrects the error(s). After the error correction by the decoder 35e, the 10-bit data as information data are supplied to the 10-bit/eight-bit converter 35f wherein two bits are removed from the supplied data for conversion into eight-bit data (see FIG. 13) to provide output data Dout.

In the flash memory 30 shown in FIG. 8, a data write operation is carried out as follows. That is, one-byte (8-bit) input data Din are fed to the encoder 32. Then, the encoder 32 adds two-byte zeros to the input data Din for conversion into 10-bit data. The 10-bit data are converted to a Reed-Solomon code capable of correcting two errors in 512-symbol information data. The eight-bit data before supplementing with 0 are outputted as information data, while the eight-bit data after the change of the bit configuration are outputted as check data. Then, the eight-bit write data WD outputted by the encoder 32 are converted by the eight-bit/four-bit converter 33 into four-bit data and fed to the cell arrays 31. The supplied four-bit data are written successively to memory cells making up the cell arrays 31.

On the other hand, a data read operation takes place as follows. Four-bit read data RD retrieved from the cell arrays 31 are converted by the four-bit/eight-bit converter 34 into eight-bit data that are fed to the decoder 35. Given the eight-bit data, the decoder 35 adds two-bit zeros to each 512-byte information data part for conversion into 10-bit data; each five-byte check data part has its bit configuration changed for conversion from eight-bit to 10-bit data. This reconstitutes the Reed-Solomon code capable of correcting two errors in the 512-symbol information data. Furthermore, the decoder 35 subjects the reconstituted Reed-Solomon code to an error correction process. From the corrected information data, two bits are removed for conversion into eight-bit data that are outputted as the output data Dout in units of bytes.

Figure 14:
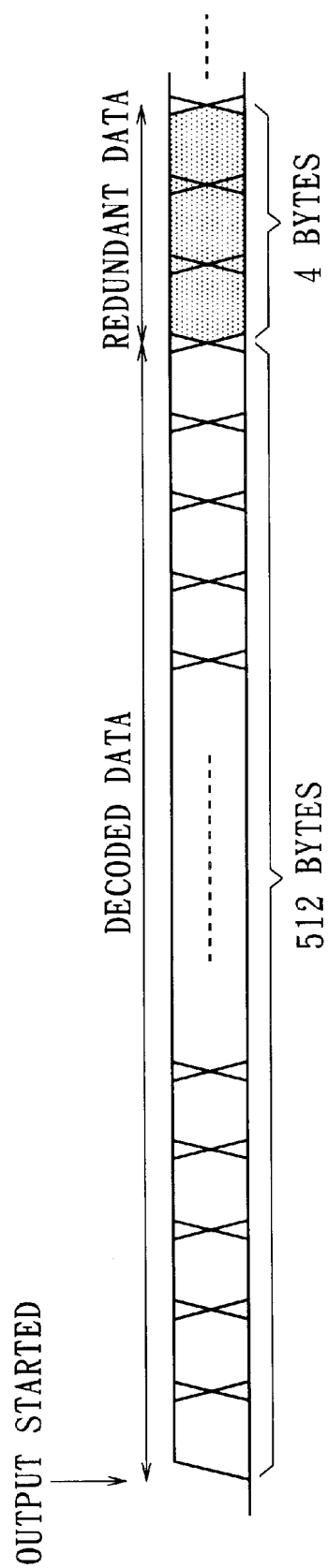
FIG. 14 is an explanatory view depicting the continuity of decoded data.

With the third embodiment, as described, the input data Din and the output data Dout are eight-bit data and the encoder 32 performs its encoding operation using the Reed-Solomon code reckoning 10 bits as one symbol and thus, this makes it possible to extend the code length while maintaining data exchanges with an external entity in units of one byte (8 bits). Accordingly, there is no need to divide, for example, 512-byte information data making up each page into segments for encoding purposes. The scheme makes it possible to reduce check data (redundant data) while preserving the continuity of each page of 512-byte decoded data as shown in FIG. 14.

Effects of the third embodiment are illustrated below. It is assumed that 65,536 information data cells (i.e., 64 pages) constitute one block and 1,024 blocks make up a cell array and it is assumed that even a single error in a block triggers suppression of access to that block regarded as defective. Now, it is assumed that the probability of a normally fabricated cell becoming faulty (inaccessible) after one million write/erase operations is 0.001%. On these assumptions, the probability of a block becoming faulty after one million write/erase operations is compared.

Where the abbreviated Reed-Solomon code is used for double-error correction in a 512-byte information data part, with five-byte check data (redundant data) added to the data part as in the third embodiment, the probability of a faulty block becoming a reality is obtained. In this case, one abbreviated Reed-Solomon code can correct up to two symbols. If eight-bit information corresponding to two cells is regarded as one symbol, the rate of a symbol getting erroneous is given by the expression (4) below. The symbol error rate thus furnished is that of information data. The symbol error rate of check data (redundant data) is about 2.5 times the rate of a cell getting faulty, i.e., $2.5 \times 10^{-5}$.

$$1-(1-10\times10^{-5})^2 \approx 2.0\times10^{-5} \qquad (4)$$

Further, the total number of symbols is 516, and one block contains 64 codes. Because the symbol error rate of check data is higher than that of information data, the probability of a block becoming defective is evaluated through the use of the symbol error rate regarding check data. Accordingly, the probability of a faulty block becoming a reality is evaluated from the expression (5) and estimated approximately at 0.0023% or less.

$$1 - \left\{ \sum_{i=0}^{2} {}_{516}C_i (2.5 \times 10^{-5})^i (1 - 2.5 \times 10^{-5})^{516-i} \right\}^{64} \simeq 2.3 \times 10^{-5} \quad (5)$$

On the other hand, where the abbreviated Reed-Solomon code is used for the correction of one error (1 symbol=8 bits) in a 128-byte information data part, with two-byte check data (redundant data) added to the data part, the probability of a block getting faulty is obtained. Because the total number of symbols per code is 130 and one block contains 256 codes, the probability is estimated at about 0.086% as calculated by the expression (6) below.

$$1 - \left\{ \sum_{i=0}^{1} {}_{130}C_i (2.0 \times 10^{-5})^i (1 - 2.0 \times 10^{-5})^{130-i} \right\}^{256} \simeq 8.6 \times 10^{-4} \quad (6)$$

Therefore, when the encoding method of the third embodiment is compared with the encoding method using the abbreviated Reed-Solomon code for the correction of one error (1 symbol=8 bits) in 128-byte information data supplemented with two-byte check data (redundant data), the encoding method of the above embodiment turns out to offer higher error correcting capability than the other method; nevertheless, the byte count is reduced from 8 to 5 in the check data per page.

Figure 15:
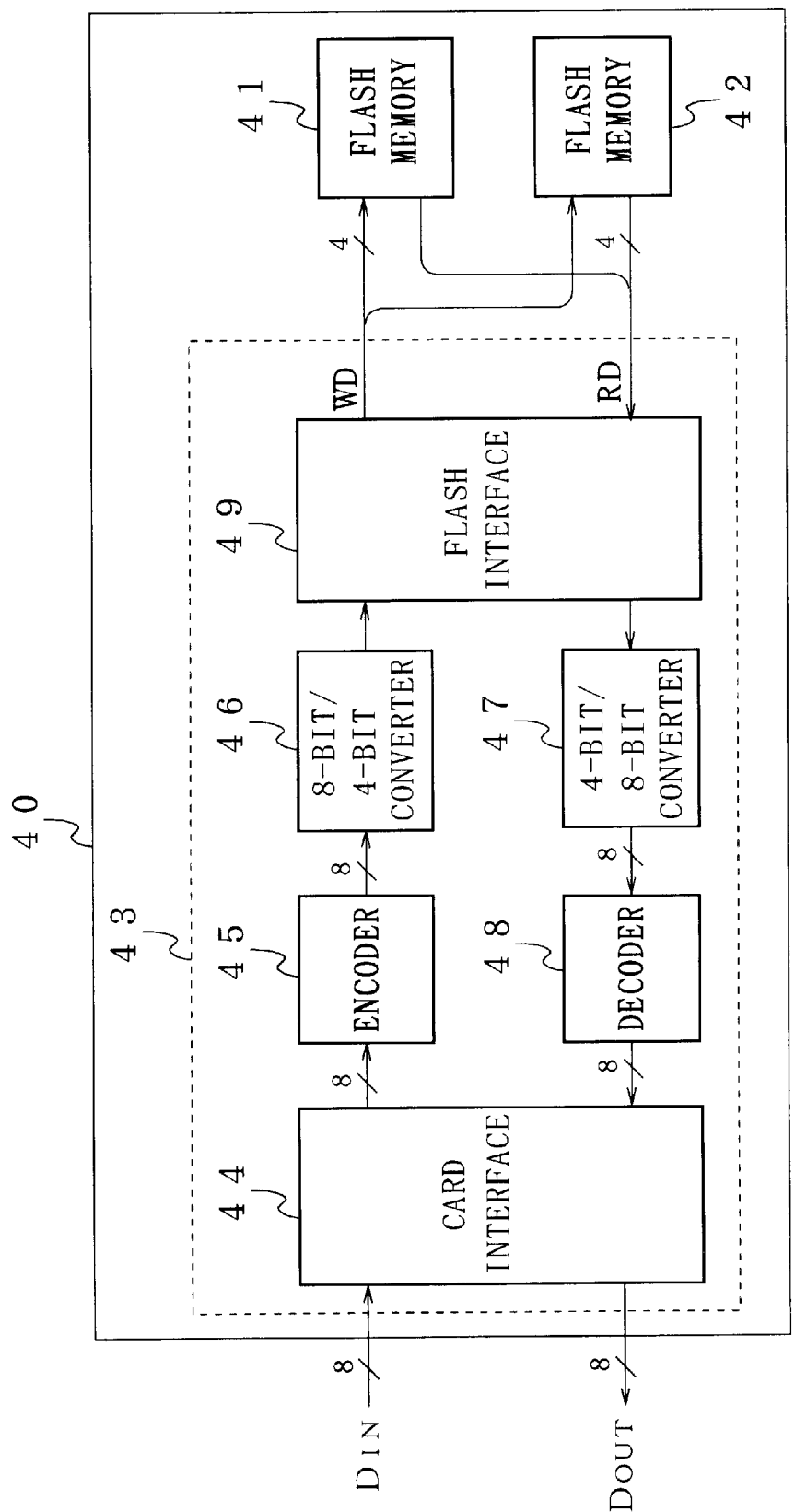
FIG. 15 is a block diagram showing a structure of a memory card practiced as a fourth embodiment of the invention.

Next, the fourth embodiment of this invention will be described. FIG. 15 shows a structure of a memory card 40 practiced as the fourth embodiment of the invention. This memory card 40 uses two flash memories for 16-value (4-bit) recording, and has a controller incorporating an error correcting circuit based on the abbreviated Reed-Solomon code reckoning 10 bits as one symbol for double-error correction. As shown in FIG. 15, the memory card 40 comprises two flash memories 41 and 42 as well as a controller 43 for writing and reading data to and from these flash memories 41 and 42.

Further, the controller 43 comprises a card interface 44 for exchanging data with an entity outside the card, an encoder 45 for converting eight-bit parallel input data Din into an abbreviated Reed-Solomon code to provide write data WD to be written to the flash memories 41 and 42, and an eight-bit/four-bit converter 46 for converting eight-bit write data WD outputted by the encoder 45 into four-bit data (four-bit data to be stored in memory cells) as shown in FIG. 3. The encoder 45 has the same structure as the encoder 32 (see FIG. 9) of the flash memory 30 in FIG. 8, so that a detailed description of the encoder 45 is committed.

Further, the controller 43 comprises a four-bit/eight-bit converter 47 for converting four-bit read data RD retrieved from the flash memory 41 or 42 into eight-bit data as shown in FIG. 3, a decoder 48 for subjecting to an error correction process the eight-bit read data RD converted in the four-bit/eight-bit converter 47 to provide output data Dout, and a flash interface 49 for controlling the writing and reading of data to and from the flash memories 41 and 42. The decoder 48 has the same structure as the decoder 35 (see FIG. 12) of the flash memory 30 in FIG. 8, so that a detailed description of the decoder 48 is omitted.

A data write operation in the memory card 40 of FIG. 15 is carried out as follows. That is, input data Din are taken into the card through the card interface 44 and fed to the encoder 45. Then, the encoder 45 supplements the input data Din with two-bit zeros for conversion into 10-bit data which in turn are converted into a Reed-Solomon code for correcting two errors in 512-symbol information data, and thus, the eight-bit data before supplementing with 0 are outputted as information data, while the eight-bit data after the change of the bit configuration are outputted as check data. Then, the eight-bit write data WD outputted by the encoder 45 are converted by the eight-bit/four-bit converter 46 into four-bit data that are written to the flash memory 41 or 42 under control of the flash interface 49.

On the other hand, a data read operation takes place as follows. Four-bit read data RD retrieved from the flash memory 41 or 42 under control of the flash interface 49 are converted by the four-bit/eight-bit converter 47 into eight-bit data that are fed to the decoder 48. The decoder 48 supplements each 512-byte information data part with two-bit zeros to convert the eight-bit data into 10-bit data, and each five-byte check data part has its bit configuration changed for conversion from eight-bit to 10-bit data so that the Reed-Solomon code capable of correcting two errors in the 512-symbol information data is reconstituted. Furthermore, the decoder 48 subjects the reconstituted Reed-Solomon code to an error correction process and two bits are removed from the corrected information data for conversion into eight-bit data that are outputted as the output data Dout in units of bytes. In this way, the output data Dout outputted by the decoder 48 are sent out of the card through the card interface 44.

With the fourth embodiment, as described, the input data Din and the output data Dout are also eight-bit data and the encoder 45 performs its encoding operation using the Reed-Solomon code reckoning 10 bits as one symbol, so that it is possible to extend the code length while maintaining data exchanges with an external entity in units of one byte (8 bits). Accordingly, there is no need to divide, for example, 512-byte information data making up each page into segments for encoding purposes and then it possible to reduce check data (redundant data) while preserving the continuity of each page of 512-byte decoded data as shown in FIG. 14.

Further, although the third and the fourth embodiments above have been shown having eight-bit data supplemented with two-bit zeros for conversion into 10-bit data at the time of encoding, the conversion into 10-bit data may be accomplished by use of other two-bit data. In such cases, the same two-bit data should be added to each information data part for conversion into 10-bit data at the time of decoding.

Further, although two-cell data have been regarded as one byte in the first through the fourth embodiments above, a number of cell regarded as one byte is not limited to these two-cell data, so that other alterations such that one-cell data are regarded as one byte or three or other appropriate number of cells of data are regarded as one byte, may be conceived.

Still further, the first through the fourth embodiments above have been shown adopting a flash memory arrangement as their storage system, but the invention is not limited to flash memories but may be applied alternatively to other diverse storage systems such as semiconductor memories.

As described and according to the invention, the Reed-Solomon code for error correction in units of bytes is used as the error correcting code applied to a memory arrangement composed of memory cells each storing multi-bit data, thereby providing sufficient performance involving a limited number of correcting errors, reducing the error correcting circuit in scale with a smaller number of memory cells incorporated than before.

Further, since, according to the invention, the input and output data are m-bit data and the encoder performs its encoding operation using the Reed-Solomon code reckoning n bits (n>m) as one symbol, it possible to extend the code length while maintaining data exchanges with an external entity in units of m bits. Therefore, there is no need to divide each information data part of a predetermined length into segments for encoding purposes, thereby reducing the amount of check data (redundant data) while preserving the continuity of decoded data.

INDUSTRIAL APPLICABILITY

As described above, the encoding method and memory apparatus according to the invention may be adapted advantageously to multi-value recording flash memories and memory cards using such memories, among others.

What is claimed is:

1. A memory apparatus comprising:

cell arrays having a plurality of memory cells, each memory cell storing multi-bit data;

an encoder for converting input data into a Reed-Solomon code to provide write data to be written to said cell arrays;

a Reed-Solomon code decoder for subjecting read data retrieved from said cell arrays to an error correction process to provide output data, said input data and said output data either parallel or serial data of a predetermined number of bits a first bit converter furnished upstream of said encoder to convert said input data into one-byte parallel data and a second bit converter furnished downstream of said Reed-Solomon code decoder to convert one-byte parallel data outputted by said Reed-Solomon code decoder into either parallel or serial data of said predetermined number of bits.

2. A memory apparatus comprising:

cell arrays having a plurality of memory cells, each memory cell storing multi-bit data;

an encoder for converting input data into a Reed-Solomon code to provide write data to be written to said cell arrays; and a Reed-Solomon code decoder for subjecting read data retrieved from said cell arrays to an error correction process to provide output data, each of said plurality of memory cells constituting said cell arrays stores m-bit data, m being an integer of at least two;

a third bit converter furnished interposingly between said encoder and said cell arrays to convert one-byte parallel data outputted by said encoder into m-bit parallel data; and a fourth bit converter furnished interposingly between said cell arrays and said Reed-Solomon code decoder to convert m-bit parallel data outputted by said cell arrays into one-byte parallel data.

3. An encoding method comprising the steps of:

supplementing (n-m) bit data with m-bit data for conversion into n-bit data, n being greater than m;

encoding said n-bit data using a Reed-Solomon code reckoning n bits as one symbol; and outputting as information data the m-bit data before supplementing said (n-m) bit data while outputting as check data the m-bit data after having undergone n-bit/m-bit conversion.

4. A memory apparatus comprising:

cell arrays having a plurality of memory cells;

an encoder for converting input data into an error correcting code to provide write data to be written to said cell arrays; and a decoder for subjecting read data retrieved from said cell arrays to an error correction process to provide output data;

characterized in that:

said encoder supplements (n-m) bit data with m-bit input data for conversion into n-bit data, n being greater than m, encodes said n-bit data using a Reed-Solomon code reckoning n bits as one symbol and outputs as information data the m-bit data before supplementing said (n-m) bit data while outputting as check data the m-bit data after having undergone n-bit/m-bit conversion; and said decoder supplements said (n-m) bit data relating to an information data part thereof with the m-bit read data retrieved from said cell arrays for conversion into n-bit data, subjects a check data part to m-bit/n-bit conversion into n-bit data, thereafter submits the converted n-bit data to an error correction process and provides as said output data an m-bit data part in the corrected n-bit information data.

5. A memory apparatus according to claim 4, characterized in that each of said plurality of memory cells constituting said cell arrays stores q-bit data, q being an integer of at least one, said memory apparatus further comprising:

m-bit/q-bit converter furnished interposingly between said encoder and said cell arrays to convert m-bit data outputted by said encoder into q-bit data; and a q-bit/m-bit converter furnished interposingly between said cell arrays and said decoder to convert q-bit data outputted by said cell arrays into m-bit data.

6. A memory apparatus comprising a memory portion having cell arrays made of a plurality of memory cells and a controller for writing and reading data to and from said memory portion, characterized in that:

said controller includes an encoder for converting input data into an error correcting code to provide write data to be written to said memory portion; and a decoder for subjecting read data retrieved from aid memory portion to an error correction process to provide output data;

wherein said encoder supplements (n-m) bit data with m-bit input data for conversion into n-bit data, n being greater than m, encodes said n-bit data using a Reed-Solomon code reckoning n bits as one symbol and outputs as information data the m-bit data before supplementing said (n-m) bit data while outputting as check data the m-bit data after having undergone n-bit/m-bit conversion; and wherein said decoder supplements said n-m bit data with m-bit read data retrieved from said cell arrays for conversion into n-bit data relating to an information data part thereof, subjects a check data part of said m-bit read data to m-bit/n-bit conversion into n-bit data, thereafter submits the converted n-bit data to an error correction process and provides as said output data an m-bit data part in the corrected n-bit information data.

7. A memory apparatus according to claim 6, characterized in that said memory portion is constituted by at least one flash memory.

* * * * *